(12) United States Patent
Kugimiya

(10) Patent No.: US 12,538,635 B2
(45) Date of Patent: Jan. 27, 2026

(54) SOLID-STATE IMAGING ELEMENT AND ELECTRONIC APPARATUS

(71) Applicant: SONY SEMICONDUCTOR SOLUTIONS CORPORATION, Kanagawa (JP)

(72) Inventor: Katsuhisa Kugimiya, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 325 days.

(21) Appl. No.: 18/256,289

(22) PCT Filed: Dec. 7, 2021

(86) PCT No.: PCT/JP2021/044959
§ 371 (c)(1),
(2) Date: Jun. 7, 2023

(87) PCT Pub. No.: WO2022/131077
PCT Pub. Date: Jun. 23, 2022

(65) Prior Publication Data
US 2024/0107786 A1    Mar. 28, 2024

(30) Foreign Application Priority Data
Dec. 16, 2020   (JP) .................. 2020-208035

(51) Int. Cl.
*H10K 39/32*   (2023.01)
*H10K 39/00*   (2023.01)
*H10K 39/38*   (2023.01)

(52) U.S. Cl.
CPC ............. *H10K 39/32* (2023.02); *H10K 39/38* (2023.02); *H10K 39/601* (2023.02)

(58) Field of Classification Search
CPC ........ H04N 25/70; H04N 25/76; H10K 39/32; H10K 39/38; H10K 39/601; H10K 39/00;
(Continued)

(56) References Cited

U.S. PATENT DOCUMENTS 9,236,408 B2 * 1/2016 Yamazaki ............. H10F 39/811
11,393,854 B2 * 7/2022 Kim ...................... H10F 39/812
(Continued)

FOREIGN PATENT DOCUMENTS

JP   10-084106 A    3/1998
JP   2003-243641 A  8/2003
(Continued)

OTHER PUBLICATIONS

International Search Report and Written Opinion of PCT Application No. PCT/JP2021/044959, issued on Mar. 8, 2022, 08 pages of ISRWO.

*Primary Examiner* — Twyler L Haskins
*Assistant Examiner* — John H Morehead, III
(74) *Attorney, Agent, or Firm* — CHIP LAW GROUP

(57) ABSTRACT

A solid-state imaging element (1) according to the present disclosure includes a pixel array unit (10) in which a plurality of light receiving pixels (11) is two-dimensionally arranged. Each of the light receiving pixels (11) includes an organic photoelectric conversion unit (61) and another photoelectric conversion unit. The organic photoelectric conversion unit (61) includes a photoelectric conversion layer (63) made of an organic semiconductor material, a first electrode (62) located on a light incident side of the photoelectric conversion layer (63), and a second electrode (65) located on a side opposite to the light incident side of the photoelectric conversion layer (63). The other photoelectric conversion unit is located on a side opposite to the light incident side of the organic photoelectric conversion unit
(Continued)

(61), and performs photoelectric conversion in a wavelength region different from a wavelength region of the organic photoelectric conversion unit (61). The second electrode (65) is connected to a connection wiring (51) including a metal wiring (54) made of metal and a transparent wiring (53) made of a transparent conductive film. The metal wiring (54) extends in a horizontal direction from a peripheral portion of the light receiving pixel (11) to a peripheral portion of the pixel array unit (10).

8 Claims, 25 Drawing Sheets

(58) Field of Classification Search
CPC ......... H10K 30/87; H10F 30/20; H10F 39/12; Y02E 10/549
See application file for complete search history.

(56) References Cited

U.S. PATENT DOCUMENTS

| | | | |
|---|---|---|---|
| 2011/0019042 A1* | 1/2011 | Yamaguchi | ......... H10F 39/1825 |
| | | | 257/E31.127 |
| 2020/0381473 A1* | 12/2020 | Kim | ..................... H10F 39/199 |

FOREIGN PATENT DOCUMENTS

| | | | |
|---|---|---|---|
| JP | 2006-294654 A | 10/2006 |
| KR | 10-2009-0022329 A | 3/2009 |
| WO | 2019/069752 A1 | 4/2019 |

* cited by examiner

SOLID-STATE IMAGING ELEMENT AND ELECTRONIC APPARATUS

CROSS REFERENCE TO RELATED APPLICATIONS

This application is a U.S. National Phase of International Patent Application No. PCT/JP2021/044959 filed on Dec. 7, 2021, which claims priority benefit of Japanese Patent Application No. JP 2020-208035 filed in the Japan Patent Office on Dec. 16, 2020. Each of the above-referenced applications is hereby incorporated herein by reference in its entirety.

FIELD

The present disclosure relates to a solid-state imaging element and an electronic apparatus.

BACKGROUND

In recent years, a laminated solid-state imaging element in which a plurality of photoelectric conversion units having different absorption coefficients for wavelengths of light are laminated has been proposed. In the above laminated solid-state imaging element, for example, a first photoelectric conversion unit using a photoelectric conversion layer made of an organic semiconductor material is formed on a surface of a semiconductor layer on a light incident side, and second and third photoelectric conversion units are formed inside the semiconductor layer.

The laminated solid-state imaging element is provided with a pixel array unit in which light receiving pixels having the first to third photoelectric conversion units are two-dimensionally arranged (e.g., Patent Literature 1).

CITATION LIST

Patent Literature

Patent Literature 1: WO 2019/069752 A

SUMMARY

Technical Problem

However, in the above-described conventional technique, there is a case where a drive voltage of a first photoelectric conversion unit varies between a light receiving pixel in a peripheral portion and a light receiving pixel in a central portion inside a pixel array unit. Therefore, the stability of the operation of the entire pixel array unit may be adversely affected.

Therefore, the present disclosure proposes a solid-state imaging element and an electronic apparatus capable of improving the stability of the operation of the entire pixel array unit.

Solution to Problem

According to the present disclosure, there is provided a solid-state imaging element. The solid-state imaging element includes a pixel array unit in which a plurality of light receiving pixels is two-dimensionally arranged. Each of the light receiving pixels includes an organic photoelectric conversion unit and another photoelectric conversion unit. The organic photoelectric conversion unit includes a photoelectric conversion layer made of an organic semiconductor material, a first electrode located on a light incident side of the photoelectric conversion layer, and a second electrode located on a side opposite to the light incident side of the photoelectric conversion layer. The other photoelectric conversion unit is located on a side opposite to the light incident side of the organic photoelectric conversion unit, and performs photoelectric conversion in a wavelength region different from a wavelength region of the organic photoelectric conversion unit. The second electrode is connected to a connection wiring including a metal wiring made of metal and a transparent wiring made of a transparent conductive film. The metal wiring extends in a horizontal direction from a peripheral portion of the light receiving pixel to a peripheral portion of the pixel array unit.

DESCRIPTION OF EMBODIMENTS

Hereinafter, embodiments of the present disclosure will be described with reference to the drawings. In each of the following embodiments, same parts are given the same reference signs to omit redundant description.

In recent years, a laminated solid-state imaging element in which a plurality of photoelectric conversion units having different absorption coefficients for wavelengths of light are laminated has been proposed. In the above laminated solid-state imaging element, for example, a first photoelectric conversion unit using a photoelectric conversion layer made of an organic semiconductor material is formed on a surface of a semiconductor layer on a light incident side, and second and third photoelectric conversion units are formed inside the semiconductor layer.

The laminated solid-state imaging element is provided with a pixel array unit in which light receiving pixels having the first to third photoelectric conversion units are two-dimensionally arranged.

However, in the above-described conventional technique, there is a case where a drive voltage of a first photoelectric conversion unit varies between a light receiving pixel in a peripheral portion and a light receiving pixel in a central portion inside a pixel array unit.

This is because, since the transparent wiring for supplying the drive voltage to the first photoelectric conversion unit is wired between the peripheral portion of the pixel array unit and each light receiving pixel, a voltage drop in a transparent wiring having a relatively high electric resistance is larger in the light receiving pixel in the central portion than in the light receiving pixel in the peripheral portion.

Then, there has been a possibility that the stability of the operation of the entire pixel array unit is adversely affected by variations in the drive voltage of the first photoelectric conversion unit.

Therefore, a technique capable of overcoming the above-described disadvantage to improve the stability of the entire operation of the pixel array unit has been expected.

[Configuration of Solid-State Imaging Element]

Figure 1:
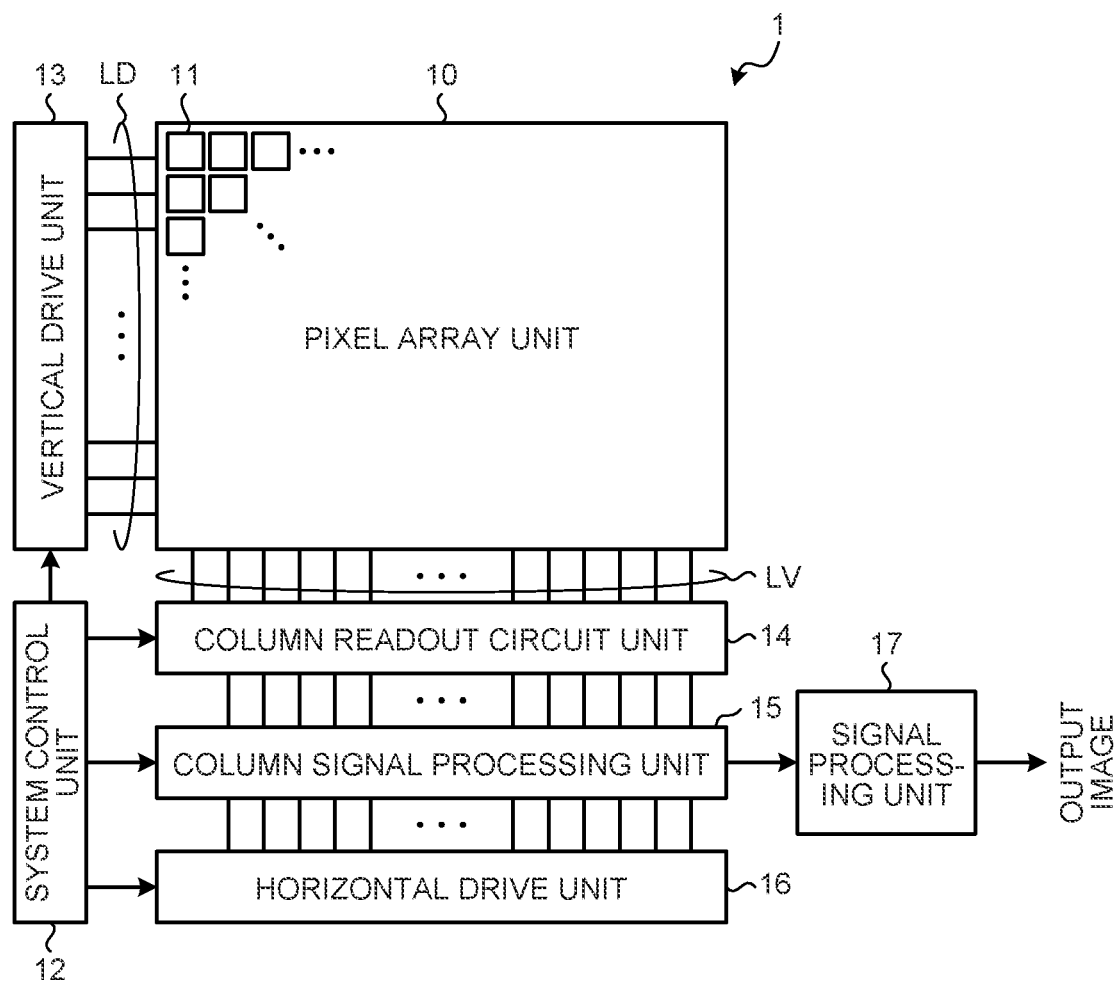
FIG. 1 is a system configuration diagram illustrating a schematic configuration example of a solid-state imaging element according to a first embodiment of the present disclosure.

FIG. 1 is a system configuration diagram illustrating a schematic configuration example of a solid-state imaging element 1 according to a first embodiment of the present disclosure. As illustrated in FIG. 1, the solid-state imaging element 1 that is a CMOS image sensor includes a pixel array unit 10, a system control unit 12, a vertical drive unit 13, a column readout circuit unit 14, a column signal processing unit 15, a horizontal drive unit 16, and a signal processing unit 17.

The pixel array unit 10, the system control unit 12, the vertical drive unit 13, the column readout circuit unit 14, the column signal processing unit 15, the horizontal drive unit 16, and the signal processing unit 17 are provided on a same semiconductor substrate or on a plurality of laminated semiconductor substrates that are electrically connected.

In the pixel array unit 10, light receiving pixels 11 (hereinafter also referred to as "pixels 11") are two-dimensionally arranged in a matrix. Each of the light receiving pixels has a photoelectric conversion element (such as an organic photoelectric conversion unit 61 (see FIG. 2)) capable of photoelectrically converting a charge amount according to an incident light amount, accumulating the charge amount therein, and outputting the charge amount as a signal.

Furthermore, in addition to the light receiving pixels 11, the pixel array unit 10 may include a region in which a dummy pixel having a structure without the photoelectric conversion element or the like, a light-shielding pixel in which light incidence from outside is shielded by shielding a light receiving surface, and the like are arranged in rows and/or columns.

Note that the light-shielding pixel may have the same configuration as the light receiving pixel 11 except for a light-shielding structure on the light receiving surface. In addition, hereinafter, a photocharge of the charge amount according to the incident light amount may also be simply referred to as "charge".

In the pixel array unit 10, a pixel drive line LD is formed for each row in a left-right direction in the drawing (pixel array direction of a pixel row) with respect to the pixel array in a matrix, and a vertical pixel wiring LV is formed for each column in a top-bottom direction in the drawing (pixel array direction of a pixel column). One end of the pixel drive line LD is connected to an output terminal corresponding to each row of the vertical drive unit 13.

The column readout circuit unit 14 includes at least a circuit that supplies a constant current to the light receiving pixel 11 for each column in a selected row in the pixel array unit 10, a current mirror circuit, and a switch to change the light receiving pixel 11 to be read.

The column readout circuit unit 14 configures an amplifier together with a transistor in a selected pixel in the pixel array unit 10, converts a photocharge signal into a voltage signal, and outputs the voltage signal to the vertical pixel wiring LV.

The vertical drive unit 13 includes a shift register and an address decoder, and drives each light receiving pixel 11 of the pixel array unit 10 at the same time for all pixels or in units of rows. Although a specific configuration is omitted, the vertical drive unit 13 has a configuration including a readout scanning system and a sweep scanning system or a batch sweep and batch transfer system.

In order to read a pixel signal from the light receiving pixel 11, the readout scanning system sequentially selects and scans the light receiving pixel 11 in the pixel array unit 10 row by row. In the case of row driving (rolling shutter operation), sweep scanning is performed on a read row on which readout scanning is performed by the readout scanning system earlier than the readout scanning by time corresponding to a shutter speed.

In addition, in the case of global exposure (global shutter operation), batch sweeping is performed earlier than batch transfer by the time corresponding to the shutter speed. By the above sweeping, unnecessary charges are swept (reset) from the organic photoelectric conversion unit 61 or the like of the light receiving pixel 11 in the read row. Then, a so-called electronic shutter operation is performed by sweeping (resetting) unnecessary charges.

Here, the electronic shutter operation refers to an operation of discarding unnecessary photocharges accumulated in the organic photoelectric conversion unit 61 or the like until immediately before and newly starting exposure (starting accumulation of photocharges).

The signal read by the readout operation of the readout scanning system corresponds to an incident light amount after the immediately preceding readout operation or the electronic shutter operation. In the case of row driving, a period from a readout timing by the immediately preceding readout operation or a sweep timing by the electronic shutter operation to the readout timing by the current readout operation is a photocharge accumulation time (exposure time) in the light receiving pixel 11. In the case of global exposure, time from batch sweeping to batch transfer is the accumulation time (exposure time).

The pixel signal selectively scanned by the vertical drive unit 13 is output from each light receiving pixel 11 in the pixel row, and supplied to the column signal processing unit 15 through each of the vertical pixel wirings LV. The column signal processing unit 15 performs predetermined signal processing, for each pixel column of the pixel array unit 10, on the pixel signal output from each light receiving pixel 11 in the selected row through the vertical pixel wiring LV, and temporarily holds the pixel signal after the signal processing.

Specifically, the column signal processing unit 15 performs at least a noise removal process such as a correlated double sampling (CDS) process as signal processing. The CDS process by the column signal processing unit 15 removes fixed pattern noise unique to pixels such as reset noise and threshold variation of an amplification transistor AMP.

Note that the column signal processing unit 15 can be configured to have, for example, an AD conversion function in addition to the noise removal process, and output the pixel signal as a digital signal.

The horizontal drive unit 16 includes a shift register and an address decoder, and sequentially selects a unit circuit corresponding to a pixel column of the column signal processing unit 15. Selective scanning by the horizontal drive unit 16 sequentially outputs the pixel signals subjected to the signal processing by the column signal processing unit 15 to the signal processing unit 17.

The system control unit 12 includes a timing generator that generates various timing signals, and performs drive control of the vertical drive unit 13, the column signal processing unit 15, the horizontal drive unit 16, and the like based on various timing signals generated by the timing generator.

The solid-state imaging element 1 further includes the signal processing unit 17 and a data storage unit (not illustrated). The signal processing unit 17 has at least an addition processing function, and performs various types of signal processing such as an addition process on the pixel signal output from the column signal processing unit 15.

The data storage unit temporarily stores data necessary for signal processing in the signal processing unit 17. The signal processing unit 17 and the data storage unit may be an external signal processing unit provided on a substrate different from the solid-state imaging element 1, such as a digital signal processor (DSP) or software, or may be mounted on the same substrate as the solid-state imaging element 1.

[Structure of Pixel Array Unit]

Figure 2:
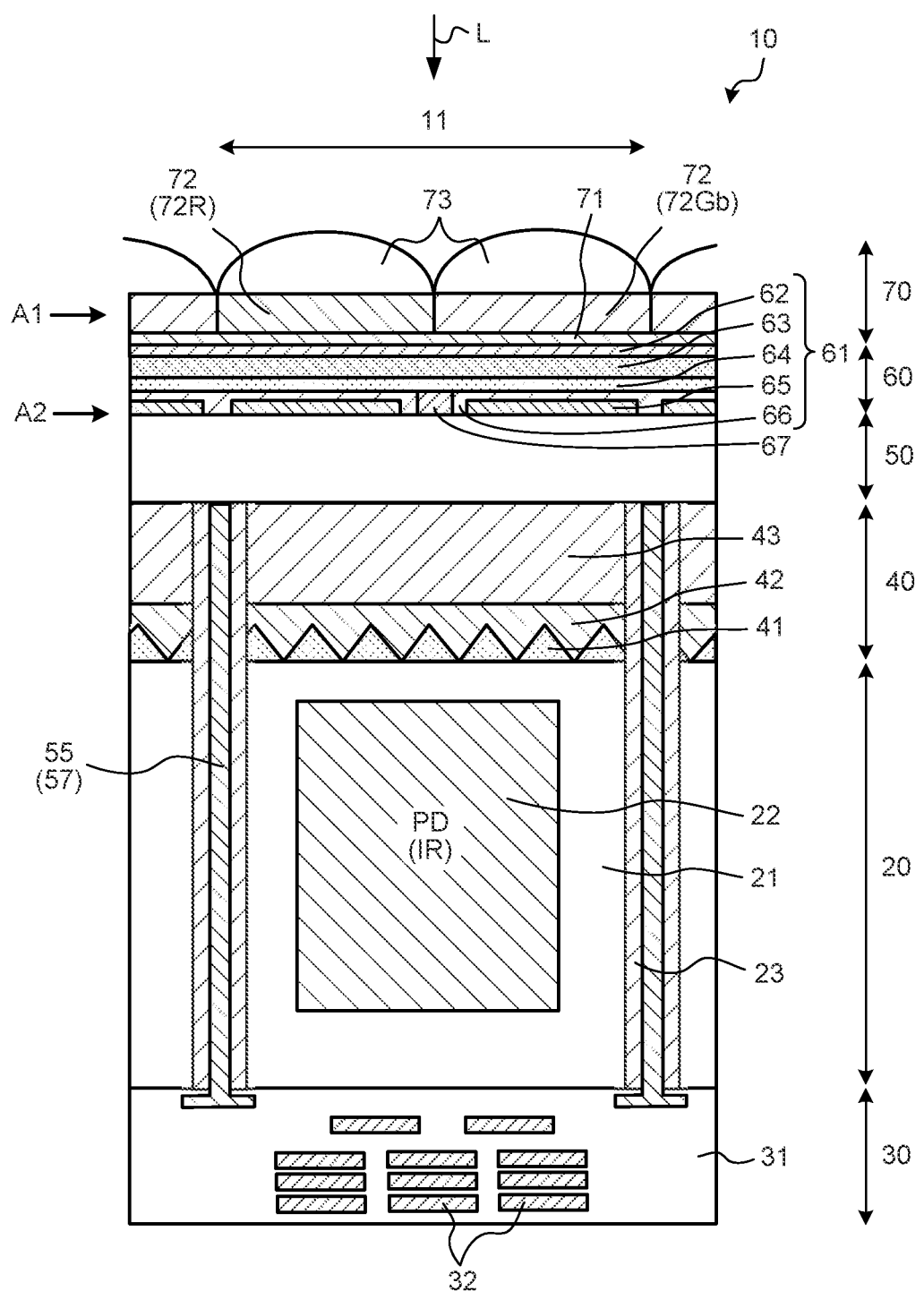
FIG. 2 is a cross-sectional view schematically illustrating a structure of a pixel array unit according to the first embodiment of the present disclosure.

Next, a detailed structure of the pixel array unit 10 will be described with reference to FIGS. 2 and 3. FIG. 2 is a cross-sectional view schematically illustrating a structure of the pixel array unit 10 according to the first embodiment of the present disclosure.

As illustrated in FIG. 2, the pixel array unit 10 includes a semiconductor layer 20, a wiring layer 30, a light control layer 40, a wiring layer 50, an organic photoelectric conversion layer 60, and a light incident layer 70. In the pixel array unit 10, the light incident layer 70, the organic photoelectric conversion layer 60, the wiring layer 50, the light control layer 40, the semiconductor layer 20, and the wiring layer 30 are laminated in this order from a side on which incident light L from outside enters (hereinafter also referred to as a light incident side).

The semiconductor layer 20 is made of, for example, a semiconductor material such as silicon (Si). However, the material of the semiconductor layer 20 is not limited to silicon, and various semiconductor materials including compound semiconductors such as GaAs, InGaAs, InP, AlGaAs, InGaP, AlGaInP, and InGaAsP may be used.

The semiconductor layer 20 includes a semiconductor region 21 of a first conductivity type (e.g., P type) and a semiconductor region 22 of a second conductivity type (e.g., N type). Then, by forming the semiconductor region 22 of the second conductivity type in the semiconductor region 21 of the first conductivity type, a PN-junction photodiode PD is formed.

For example, the photodiode PD having the semiconductor region 22 as a charge accumulation region is a photoelectric conversion unit that receives infrared light (IR) and photoelectrically converts the received light. Furthermore, the photodiode PD is formed separately for each light receiving pixel 11 of the pixel array unit 10.

The wiring layer 30 is disposed on a surface of the semiconductor layer 20 opposite to the light incident side. The wiring layer 30 is configured by forming a plurality of wiring films 32 and a plurality of pixel transistors (not illustrated) in an interlayer insulating film 31. The plurality of pixel transistors performs reading or the like of charges accumulated in the photodiode PD and the organic photoelectric conversion unit 61 described later.

The light control layer 40 is disposed on a surface of the semiconductor layer 20 on the light incident side. The light control layer 40 includes an uneven portion 41, a planarization film 42, and an IR pass filter 43. The uneven portion 41 has, for example, a fine uneven structure formed on a surface of the semiconductor layer 20 on the light incident side.

The uneven portion 41 is provided to suppress reflection of incident light (e.g., infrared light) on the semiconductor layer 20. The uneven portion 41 may have, for example, a structure referred to as a so-called moth-eye structure, or an uneven structure having a size and a pitch different from those of the moth-eye structure.

The planarization film 42 is disposed on a surface of the uneven portion 41 on the light incident side. The planarization film 42 is provided to planarize a surface on which the IR pass filter 43 is formed and to avoid unevenness generated in a rotational coating process when the IR pass filter 43 is formed. The planarization film 42 is made of, for example, silicon oxide ($SiO_2$).

Note that the planarization film 42 is not limited to the case of being formed of silicon oxide, and may be formed of silicon nitride (SiN), an organic material (e.g., acrylic resin), or the like.

The IR pass filter 43 is a filter in which a transmission wavelength band is set to a wavelength of infrared light. By arranging the IR pass filter 43 on the light incident side of the photodiode PD, it is possible to suppress the incidence of visible light on the photodiode PD, and thus, it is possible to improve an S/N ratio of IR light to visible light. Therefore, according to the first embodiment, the photodiode PD can accurately detect the infrared light.

The wiring layer 50 is disposed on a surface of the light control layer 40 on the light incident side. A connection wiring 51 (see FIG. 4), an FD wiring 55 (see FIG. 7), and the like, which are respectively connected to the organic photoelectric conversion unit 61 and an FD 67 to be described later, are arranged in the wiring layer 50. A detailed structure of the wiring layer 50 will be described later.

The organic photoelectric conversion layer 60 is disposed on a surface of the wiring layer 50 on the light incident side. The organic photoelectric conversion layer 60 includes a first electrode 62, a photoelectric conversion layer 63, a charge storage layer 64, a second electrode 65, an insulating layer 66, and a floating diffusion 67 (hereinafter also referred to as the FD 67).

In the organic photoelectric conversion layer 60, the first electrode 62, the photoelectric conversion layer 63, the charge storage layer 64, the insulating layer 66, and the second electrode 65 are laminated in this order from the light incident side, and the FD 67 is laminated under the charge storage layer 64 in a part of a portion where the second electrode 65 is not disposed.

Then, the first electrode 62, the photoelectric conversion layer 63, the charge storage layer 64, the insulating layer 66, and the second electrode 65 are laminated to form the organic photoelectric conversion unit 61.

Figure 3:
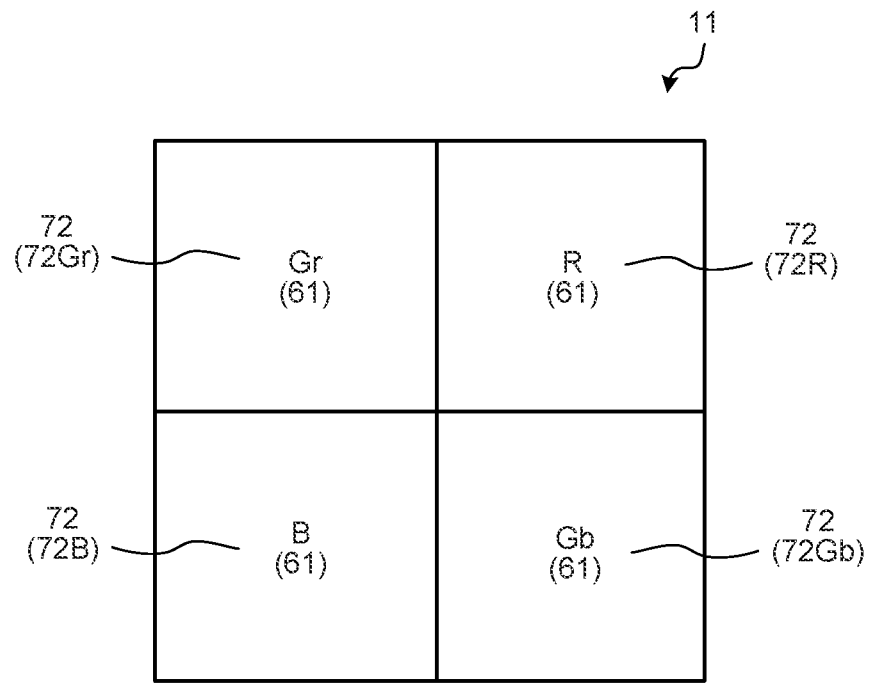
FIG. 3 is a plan view schematically illustrating an arrangement of an individual organic photoelectric conversion unit in a light receiving pixel according to the first embodiment of the present disclosure.

FIG. 3 is a plan view schematically illustrating an arrangement of the organic photoelectric conversion unit 61 in the light receiving pixel 11 according to the first embodiment of the present disclosure. FIG. 3 is a view corresponding to a plan view of a depth A1 in FIG. 2.

As illustrated in FIG. 3, four organic photoelectric conversion units 61 are provided in two rows and two columns in one light receiving pixel 11. The four organic photoelectric conversion units 61 include a red photoelectric conversion unit R, green photoelectric conversion units Gr and Gb, and a blue photoelectric conversion unit B.

A color filter 72R that transmits red light is disposed on the light incident side of the red photoelectric conversion unit R. Color filters 72Gr and 72Gb that transmit green light are arranged on the light incident side of the green photoelectric conversion units Gr and Gb. A color filter 72B that transmits blue light is disposed on the light incident side of the blue photoelectric conversion unit B.

Then, the color filters 72 that transmit the light of respective colors are arranged in a predetermined array (e.g., Bayer array) in the light receiving pixel 11. As a result, in the first embodiment, the red, blue, and green lights can be photoelectrically converted in the four organic photoelectric conversion units 61 of the light receiving pixel 11.

The description returns to FIG. 2. In the organic photoelectric conversion layer 60, the first electrode 62, the photoelectric conversion layer 63, the charge storage layer 64, and the insulating layer 66 are commonly formed in all the light receiving pixels 11 of the pixel array unit 10.

On the other hand, the FD 67 is formed separately for each light receiving pixel 11 of the pixel array unit 10. The second electrode 65 is formed separately for each of the red photoelectric conversion unit R, the green photoelectric conversion units Gr and Gb, and the blue photoelectric conversion unit B illustrated in FIG. 3.

The first electrode 62 is disposed in the horizontal direction to a peripheral portion of the pixel array unit 10, and is electrically connected to the wiring film 32 of the wiring layer 30 via a wiring layer, a through electrode (both not illustrated), and the like at the peripheral portion of the pixel array unit 10. As a material of the first electrode 62, for example, a transparent conductive material such as indium tin oxide (ITO) is used.

The material of the first electrode 62 is not limited to ITO, and various transparent conductive materials (e.g., tin oxide ($SnO_2$), zinc oxide (ZnO), IZO, IGO, IGZO, ATO, AZO) and the like can be used.

The IZO is an oxide obtained by adding indium to zinc oxide, the IGO is an oxide obtained by adding indium to gallium oxide, and the IGZO is an oxide obtained by adding indium and gallium to zinc oxide. The ATO is an oxide obtained by adding antimony to tin oxide, and the AZO is an oxide obtained by adding antimony to zinc oxide.

The photoelectric conversion layer 63 is made of an organic semiconductor material, and photoelectrically converts light that has passed through the color filter 72 in the incident light L from the outside.

The photoelectric conversion layer 63 desirably includes one or both of a p-type organic semiconductor and an n-type organic semiconductor. The photoelectric conversion layer 63 is made of, for example, quinacridone, a quinacridone derivative, a subphthalocyanine, and a subphthalocyanine derivative, and desirably contains at least one of these materials.

Note that the photoelectric conversion layer 63 is not limited to such a material, and may be, for example, at least one of naphthalene, anthracene, phenanthrene, tetracene, pyrene, perylene, and fluoranthene (all including derivatives).

For the photoelectric conversion layer 63, a polymer or a derivative of phenylenevinylene, fluorene, carbazole, indole, pyrene, pyrrole, picoline, thiophene, acetylene, diacetylene, or the like may be used.

For the photoelectric conversion layer 63, a metal complex dye, a cyanine-based dye, a merocyanine-based dye, a phenylxanthene-based dye, a triphenylmethane-based dye, a rhodacyanine-based dye, a xanthene-based dye, or the like may be used.

Examples of the metal complex dye include a dithiol metal complex-based dye, a metal phthalocyanine dye, a metal porphyrin dye, and a ruthenium complex dye. The photoelectric conversion layer 63 may contain other organic materials such as fullerene (CH) and bathocuproine (BCP) in addition to the above organic semiconductor dyes.

For the photoelectric conversion layer 63 according to the first embodiment, for example, a so-called panchromatic film having sensitivity over the entire visible light wavelength region may be used. As a result, desired photoelectric conversion efficiency can be achieved in all of the red photoelectric conversion unit R, the green photoelectric conversion units Gr and Gb, and the blue photoelectric conversion unit B formed in the organic photoelectric conversion layer 60.

The charge storage layer 64 is provided between the photoelectric conversion layer 63 and the insulating layer 66 or the FD 67, and stores the charge generated in the photoelectric conversion layer 63. The charge storage layer 64 is preferably formed using a material having higher charge mobility and a larger band gap than the photoelectric conversion layer 63.

For example, the band gap of a constituent material of the charge storage layer 64 is preferably 3.0 eV or more. Examples of the material include an oxide semiconductor material such as IGZO and an organic semiconductor material.

Examples of the organic semiconductor material include transition metal dichalcogenide, silicon carbide (SiC), diamond, graphene, carbon nanotubes, fused polycyclic hydrocarbon compounds, and fused heterocyclic compounds.

By providing the charge storage layer 64 below the photoelectric conversion layer 63, it is possible to prevent recombination of charges at the time of charge storage, so as to improve transfer efficiency.

As a material of the second electrode 65 and the FD 67, for example, a transparent conductive material such as ITO is used. Note that the material of the second electrode 65 and the FD 67 is not limited to ITO, and various transparent conductive materials (e.g., tin oxide, zinc oxide, IZO, IGO, IGZO, ATO, AZO) can be used.

Furthermore, as a material of the insulating layer 66, for example, an insulating material such as silicon oxide or silicon nitride is used. Note that the material of the insulating layer 66 is not limited to silicon oxide or silicon nitride, and various insulating films may be used as long as the insulating film can transmit light in a wavelength band to be detected by the photodiode PD located in a lower layer.

Charges generated by photoelectric conversion in the organic photoelectric conversion unit 61 are accumulated in the FD 67. The FD 67 temporarily accumulates the charges photoelectrically converted by the organic photoelectric conversion unit 61 until the charges are read by the corresponding pixel transistor.

Specifically, in the organic photoelectric conversion layer 60, a predetermined voltage is applied from a drive circuit (not illustrated) to the FD 67, the second electrode 65, and the first electrode 62 in a charge accumulation period. For example, in the charge accumulation period, a positive voltage is applied to the FD 67 and the second electrode 65, and a negative voltage is applied to the first electrode 62. Furthermore, in the charge accumulation period, a larger positive voltage is applied to the second electrode 65 than the FD 67.

As a result, in the charge accumulation period, electrons included in the charge generated by photoelectric conversion in the photoelectric conversion layer 63 are attracted by the large positive voltage of the second electrode 65 and accumulated in the charge storage layer 64.

Furthermore, in the light receiving pixel 11, a reset operation is performed by operating a reset transistor (not illustrated) in a latter part of the charge accumulation period. As a result, the potential of the FD 67 is reset, and the potential of the FD 67 becomes the power supply voltage.

In the light receiving pixel 11, a charge transfer operation is performed after completion of the reset operation. In the charge transfer operation, a positive voltage higher than that of the second electrode 65 is applied to the FD 67 from the drive circuit. As a result, electrons accumulated in the charge storage layer 64 are transferred to the FD 67.

In the light receiving pixel 11, a series of operations including the charge accumulation operation, the reset operation, and the charge transfer operation is completed by the above operation. Note that, in the light receiving pixel 11 according to the first embodiment, the four organic photoelectric conversion units 61 arranged in the organic photoelectric conversion layer 60 share one FD 67.

In the organic photoelectric conversion unit 61 of the present disclosure, a charge blocking film, a buffer film, a work function adjustment film, and the like may be laminated in addition to the first electrode 62, the photoelectric conversion layer 63, the charge storage layer 64, the insulating layer 66, and the second electrode 65.

For example, an electron blocking film or an electron blocking/buffer film may be inserted between the first electrode 62 and the photoelectric conversion layer 63. In addition, a hole blocking film, a hole blocking/buffer film, a work function adjustment film, or the like may be inserted between the photoelectric conversion layer 63 and the insulating layer 66.

The light incident layer 70 includes a planarization film 71, a color filter 72, and an on-chip lens (OCL) 73. In the light incident layer 70, the OCL 73, the color filter 72, and the planarization film 71 are laminated in this order from the light incident side.

The planarization film 71 is provided to planarize the surface on which the color filter 72 is formed and to avoid unevenness generated in the rotational coating process when the color filter 72 is formed. The planarization film 71 is formed of, for example, silicon oxide.

Note that the planarization film 71 is not limited to silicon oxide, and may be formed of silicon nitride, an organic material (e.g., acrylic resin), or the like.

The color filter 72 is an optical filter that transmits light of a predetermined wavelength in the incident light L condensed by the OCL 73. As described above, the color filter 72 includes the color filters 72R, 72Gr (see FIG. 3), 72Gb, and 72B (see FIG. 3).

The OCL 73 having a hemispherical shape is a lens that is provided for each organic photoelectric conversion unit 61 and condenses the incident light L on the organic photoelectric conversion unit 61 of each light receiving pixel 11. The OCL 73 is made of, for example, an acrylic resin.

[Structure of Wiring Layer]

Figure 4:
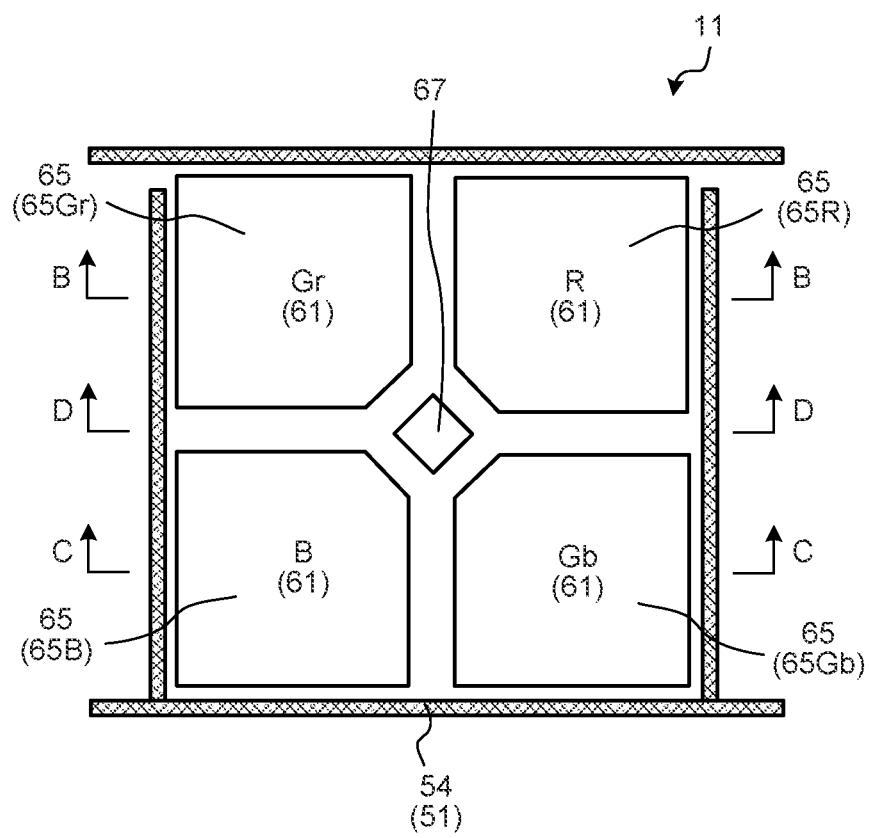
FIG. 4 is a plan view schematically illustrating an arrangement of the organic photoelectric conversion unit and a metal wiring according to the first embodiment of the present disclosure.

Next, a detailed structure of the wiring layer 50 according to the first embodiment will be described with reference to FIGS. 4 to 8. FIG. 4 is a plan view schematically illustrating an arrangement of the organic photoelectric conversion unit 61 and a metal wiring 54 according to the first embodiment of the present disclosure.

Figure 5:
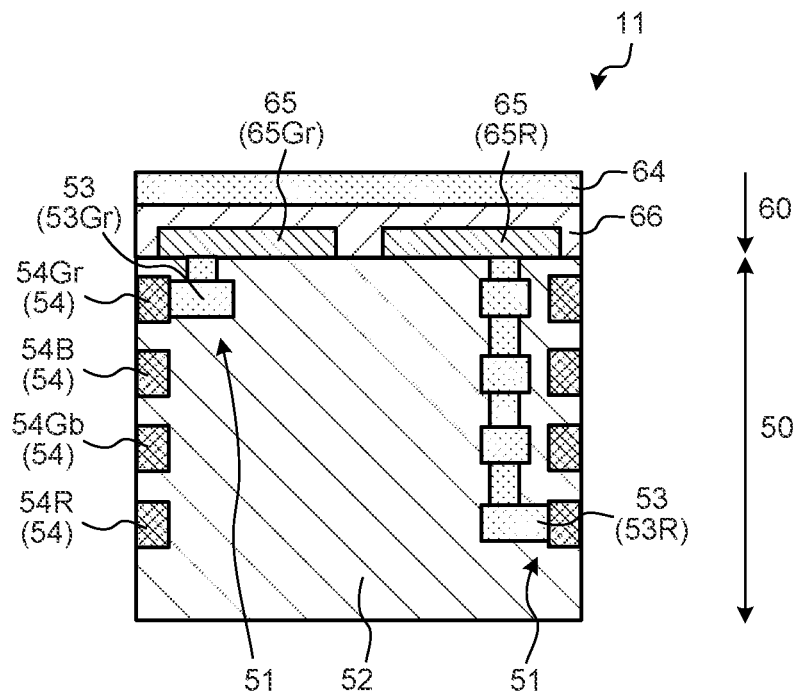
FIG. 5 is a cross-sectional view taken along line B-B of FIG. 4.
Figure 6:
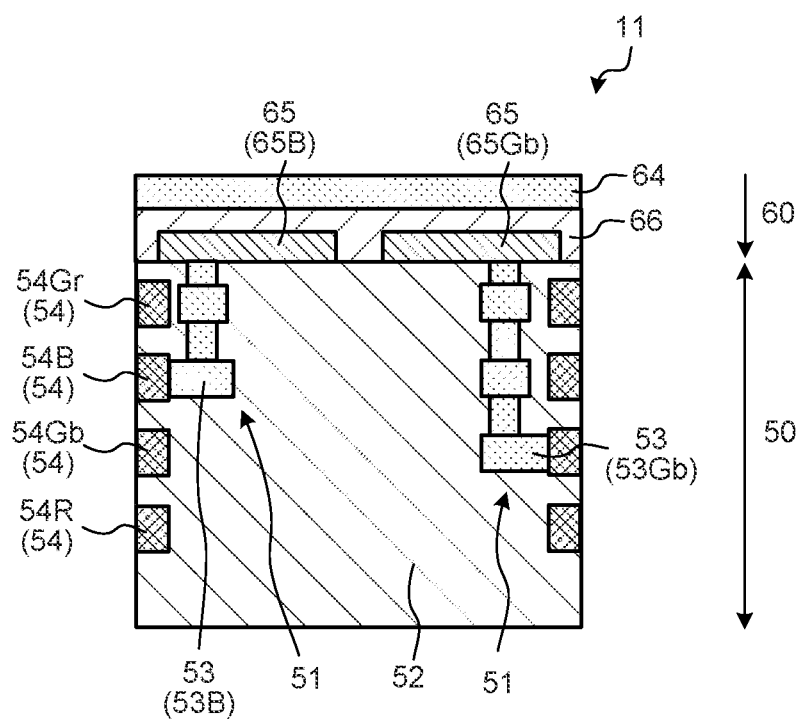
FIG. 6 is a cross-sectional view taken along line C-C of FIG. 4.
Figure 7:
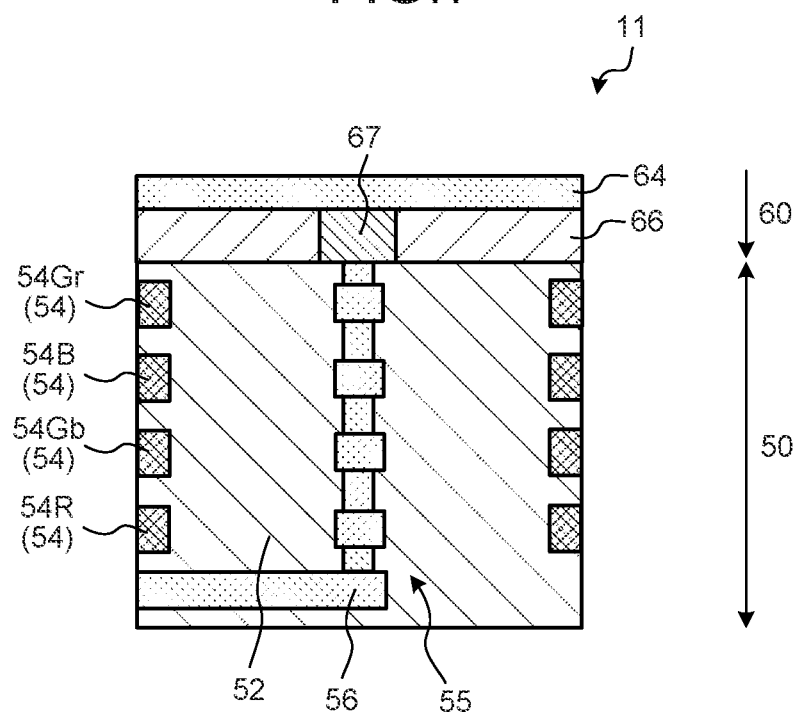
FIG. 7 is a cross-sectional view taken along line D-D of FIG. 4.
Figure 8:
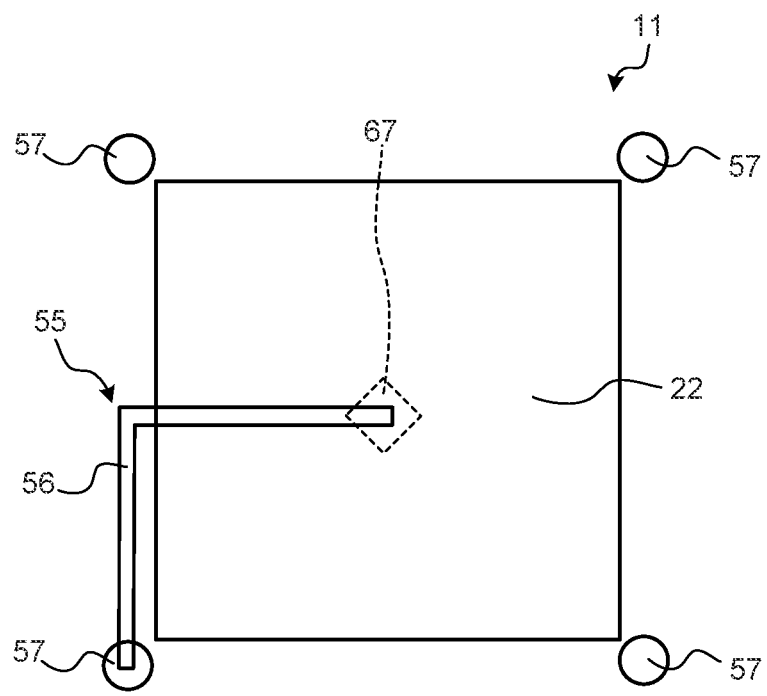
FIG. 8 is a plan view schematically illustrating an arrangement of a FD wiring according to the first embodiment of the present disclosure.

Furthermore, FIGS. 5 to 7 are cross-sectional views taken along lines B-B, C-C, and D-D illustrated in FIG. 4 as viewed in the direction of arrows, and FIG. 8 is a plan view schematically illustrating an arrangement of the FD wiring 55 according to the first embodiment of the present disclosure.

As illustrated in FIG. 4, the light receiving pixel 11 according to the first embodiment includes the four organic photoelectric conversion units 61. Among the four organic photoelectric conversion units 61, the red photoelectric conversion unit R has a second electrode 65R, the green photoelectric conversion units Gr and Gb have second electrodes 65Gr and 65Gb, and the blue photoelectric conversion unit B has a second electrode 65B.

The second electrodes 65R, 65B, 65Gr, and 65Gb are arranged in two rows and two columns in the light receiving pixel 11. In addition, the FD 67 is arranged at the center of the second electrodes 65R, 65B, 65Gr, and 65Gb arranged in two rows and two columns.

In addition, the metal wiring 54 that is a part of the connection wiring 51 electrically connected to each of the second electrodes 65 is arranged in a peripheral portion of the light receiving pixel 11. The metal wiring 54 is arranged so as to surround a periphery of the light receiving pixel 11 in plan view, and is made of a highly conductive metal such as tungsten, titanium, aluminum, or copper.

As illustrated in FIG. 5, four metal wirings 54 (metal wiring 54R, metal wiring 54Gr, metal wiring 54Gb, and metal wiring 54B) are arranged in the peripheral portion of the light receiving pixel 11. In the wiring layer 50, for example, the metal wiring 54Gr, the metal wiring 54B, the metal wiring 54Gb, and the metal wiring 54R are laminated in this order from the light incident side with a insulating layer 52 interposed therebetween.

In the first embodiment, all the metal wirings 54R, 54Gr, 54Gb, and 54B are arranged so as to surround the periphery of the light receiving pixel 11 in plan view.

As illustrated in FIG. 5 and the like, the metal wiring 54 and the second electrode 65 described above are electrically connected via a transparent wiring 53. In other words, the connection wiring 51 electrically connected to the second electrode 65 includes the transparent wiring 53 and the metal wiring 54.

For the transparent wiring 53, for example, a transparent conductive material such as ITO is used. Note that the material of the transparent wiring 53 is not limited to ITO, and various transparent conductive materials (e.g., tin oxide, zinc oxide, IZO, IGO, IGZO, ATO, AZO) can be used.

The connection wiring 51 connected to the second electrode 65R of the red photoelectric conversion unit R includes a transparent wiring 53R and a metal wiring 54R. The transparent wiring 53R is horizontally connected to the metal wiring 54R at the peripheral portion of the light receiving pixel 11, and is arranged to extend in the vertical direction from a connected portion toward the second electrode 65R.

The connection wiring 51 connected to the second electrode 65Gr of the green photoelectric conversion unit Gr includes a transparent wiring 53Gr and the metal wiring 54Gr. The transparent wiring 53Gr is connected in the horizontal direction to the metal wiring 54Gr in the peripheral portion of the light receiving pixel 11, and is arranged to extend in the vertical direction from a connected portion toward the second electrode 65Gr.

As illustrated in FIG. 6, the connection wiring 51 connected to the second electrode 65Gb of the green photoelectric conversion unit Gb includes a transparent wiring 53Gb and the metal wiring 54Gb. The transparent wiring 53Gb is horizontally connected to the metal wiring 54Gb at the peripheral portion of the light receiving pixel 11, and is arranged to extend in the vertical direction from a connected portion toward the second electrode 65Gb.

The connection wiring 51 connected to the second electrode 65B of the blue photoelectric conversion unit B includes a transparent wiring 53B and the metal wiring 54B. The transparent wiring 53B is horizontally connected to the metal wiring 54B in the peripheral portion of the light receiving pixel 11, and is arranged so as to extend in the vertical direction from a connected portion toward the second electrode 65B.

Furthermore, the metal wiring 54 extends in the horizontal direction inside the wiring layer 50 from the peripheral portion of the light receiving pixel 11 to a peripheral portion of the pixel array unit 10 (see FIG. 1). Then, the metal wiring 54 is electrically connected to the wiring film 32 (see FIG. 2) of the wiring layer 30 (see FIG. 2) via a wiring layer, a through electrode (none of which are illustrated), or the like in the peripheral portion of the pixel array unit 10.

As described above, in the first embodiment, the connection wiring 51 that supplies the drive voltage to the second electrode 65 of the organic photoelectric conversion unit 61 includes the metal wiring 54. Then, the metal wiring 54 extends in the horizontal direction from the peripheral portion of the light receiving pixel 11 to the peripheral portion of the pixel array unit 10.

As a result, electrical resistance of the connection wiring 51 can be reduced as compared with a case where the connection wiring 51 is formed entirely of the transparent wiring 53 from the second electrode 65 to the peripheral portion of the pixel array unit 10.

Therefore, according to the first embodiment, since a voltage drop of the drive voltage can be suppressed in the organic photoelectric conversion unit 61 of the light receiving pixel 11 located in a central portion of the pixel array unit 10, the stability of the operation of the entire pixel array unit 10 can be improved.

Furthermore, in a case where the metal wiring 54 of the connection wiring 51 is directly extended in the vertical direction from the peripheral portion of the light receiving pixel 11 toward the wiring layer 30, it is necessary to arrange the four metal wirings 54 per light receiving pixel 11 along a peripheral portion of the photodiode PD (see FIG. 2).

Therefore, in this case, since an area of the photodiode PD is reduced by the metal wiring 54, a quantum efficiency and a saturation charge amount of the photodiode PD are reduced.

On the other hand, in the first embodiment, since the metal wiring 54 is extended in the horizontal direction from the peripheral portion of the light receiving pixel 11 to the peripheral portion of the pixel array unit 10, an area of the photodiode PD can be maximized. Therefore, according to the first embodiment, the quantum efficiency and the saturation charge amount of the photodiode PD can be improved.

Furthermore, in the first embodiment, the metal wiring 54 located in the peripheral portion of the light receiving pixel 11 and the second electrode 65 may be electrically connected by the transparent wiring 53. As a result, more incident light L (see FIG. 2) can enter the photodiode PD in the lower layer.

Therefore, according to the first embodiment, the quantum efficiency and the saturation charge amount of the photodiode PD located in the lower layer can be improved.

Furthermore, in the first embodiment, it is preferable that the plurality of metal wirings 54R, 54Gr, 54Gb, and 54B are mutually laminated in the wiring layer 50, and the metal wirings 54R, 54Gr, 54Gb, and 54B are arranged so as to surround the periphery of the light receiving pixel 11 in plan view.

In other words, in the first embodiment, the metal wirings 54 are preferably arranged in a lattice shape along the peripheral portions of the plurality of light receiving pixels 11 arranged two-dimensionally.

As a result, the plurality of metal wirings 54R, 54Gr, 54Gb, and 54B surrounding the periphery of the light receiving pixel 11 can function as a light shielding wall of the light receiving pixel 11 located above the photodiode PD.

Therefore, according to the first embodiment, since leakage of infrared light into the photodiodes PD of the adjacent light receiving pixels 11 can be suppressed, crosstalk between adjacent photodiodes PD can be reduced.

Note that, in the first embodiment, as illustrated in FIG. 4, the same metal wiring 54 is used between the light receiving pixels 11 adjacent in the row direction (horizontal direction) in plan view, while different metal wirings 54 are used between the light receiving pixels 11 adjacent in the column direction (vertical direction).

In the first embodiment, a clearance formed between the metal wirings 54 adjacent in the column direction is disposed adjacent to the red photoelectric conversion unit R and the green photoelectric conversion unit Gr of the light receiving pixel 11.

Furthermore, in the first embodiment, as illustrated in FIGS. 5 and 6, the metal wiring 54 and the transparent wiring 53 are preferably connected in the horizontal direction in the peripheral portion of the light receiving pixel 11. As a result, as compared with the case where the metal wiring 54 and the transparent wiring 53 are connected in the vertical direction, an interval between the metal wirings 54 adjacent in a laminating direction can be narrowed.

Therefore, according to the first embodiment, since the light shielding property of the plurality of metal wirings 54 functioning as the light shielding wall can be improved, the crosstalk between the adjacent photodiodes PD can be further reduced.

In the present disclosure, the metal wiring 54 and the transparent wiring 53 are not limited to be connected in the horizontal direction, and may be connected in the vertical direction, or may be connected in the horizontal direction and the vertical direction.

In the first embodiment, as illustrated in FIGS. 7 and 8, the FD wiring 55 electrically connected to the FD 67 includes a FD transparent wiring 56 and a FD metal wiring 57. For the FD transparent wiring 56, for example, a transparent conductive material such as ITO is used. For the FD metal wiring 57, for example, a highly conductive metal material such as tungsten, titanium, aluminum, or copper is used.

Note that the material of the FD transparent wiring 56 is not limited to ITO, and various transparent conductive materials (e.g., tin oxide, zinc oxide, IZO, IGO, IGZO, ATO, AZO) can be used.

The FD transparent wiring 56 extends from the surface of the wiring layer 50 on the light incident side to the vicinity of a bottom of the wiring layer 50 as illustrated in FIG. 7, and extends from a central portion to a corner of the light receiving pixel 11 in plan view as illustrated in FIG. 8.

Furthermore, as illustrated in FIG. 2, the FD metal wiring 57 extends in the vertical direction to the wiring layer 30 through the light control layer 40 and the semiconductor layer 20. Note that an insulating layer 23 is disposed around the FD metal wiring 57 penetrating the light control layer 40 and the semiconductor layer 20.

Then, as illustrated in FIG. 8, the FD transparent wiring 56 and the FD metal wiring 57 are connected at the corner of the light receiving pixel 11.

Here, in the first embodiment, by arranging the FD metal wiring 57 of the FD wiring 55 in the vertical direction toward the wiring layer 30, a wiring path of the FD metal wiring 57 can be shortened.

Therefore, according to the first embodiment, the charge photoelectrically converted by the organic photoelectric conversion unit 61 can be quickly converted into a signal by the wiring layer 30. As a result, a signal quality of the solid-state imaging element 1 can be improved.

[Manufacturing Process of Wiring Layer]

Figure 9A:
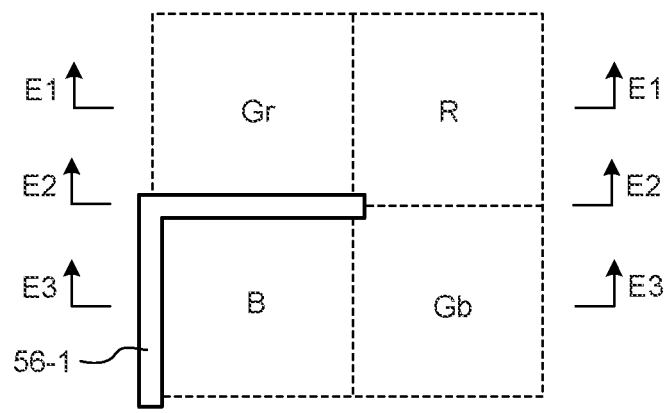
FIG. 9A is a plan view schematically illustrating one manufacturing step of a wiring layer according to the first embodiment of the present disclosure.
Figure 9B:
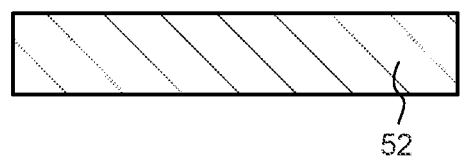
FIG. 9B is a cross-sectional view taken along line E1-E1 of FIG. 9A.
Figure 9C:
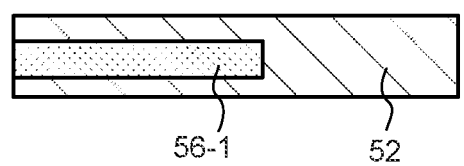
FIG. 9C is a cross-sectional view taken along line E2-E2 of FIG. 9A.
Figure 9D:
FIG. 9D is a cross-sectional view taken along line E3-E3 of FIG. 9A.

Next, an example of a manufacturing process of the wiring layer 50 according to the first embodiment will be described with reference to FIGS. 9A, 9B, 9C, 9D, 10A, 10B, 10C, 10D, 11A, 11B, 11C, 11D, 12A, 12B, 12C, 12D, 13A, 13B, 13C, 13D, 14A, 14B, 14C, 14D, 15A, 15B, 15C, and 15D. FIG. 9A is a plan view schematically illustrating one manufacturing step of the wiring layer 50 according to the first embodiment of the present disclosure, and FIGS. 9B, 9C, and 9D are cross-sectional views taken along lines E1-E1, E2-E2, and E3-E3 of FIG. 9A as viewed in the direction of arrows.

In the manufacturing process of the wiring layer 50, as illustrated in FIGS. 9A, 9B, 9C, and 9D, first, the FD transparent wiring 56 of the FD wiring 55 is formed on a surface of the light control layer 40 (see FIG. 2). Specifically, first, the insulating layer 52 is formed on the entire surface of the light control layer 40 by a conventionally known method.

Next, a FD transparent wiring 56-1 patterned in a predetermined planar shape as illustrated in FIG. 9A is formed, by a conventionally known method, on the surface of the insulating layer 52 that has been formed. Then, the insulating layer 52 is formed by a conventionally known method so as to cover the FD transparent wiring 56-1 that has been formed.

Figure 10A:
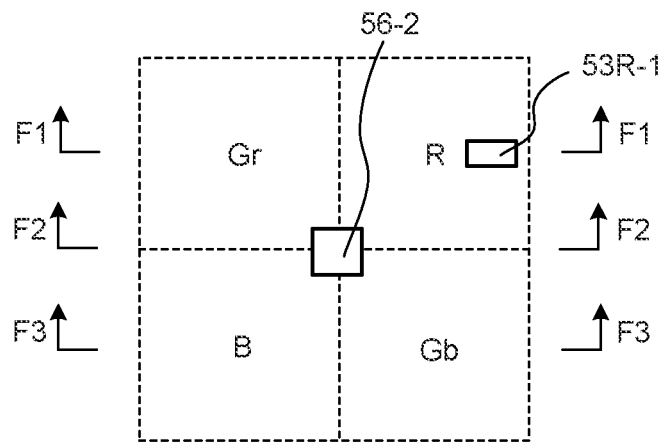
FIG. 10A is a plan view schematically illustrating one manufacturing step of the wiring layer according to the first embodiment of the present disclosure.
Figure 10B:
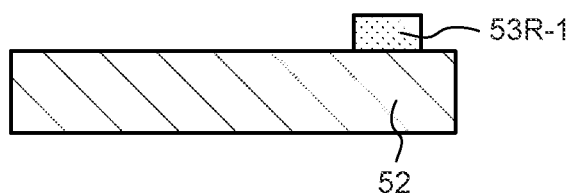
FIG. 10B is a cross-sectional view taken along line F1-F1 of FIG. 10A.
Figure 10C:
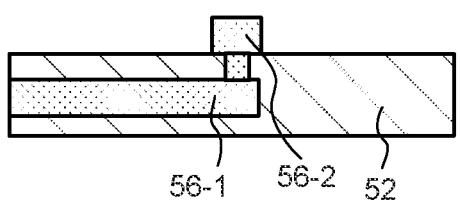
FIG. 10C is a cross-sectional view taken along line F2-F2 of FIG. 10A.
Figure 10D:
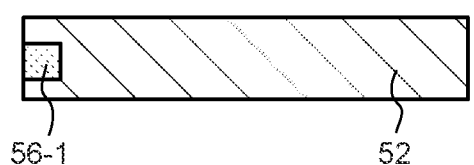
FIG. 10D is a cross-sectional view taken along line F3-F3 of FIG. 10A.

FIG. 10A is a plan view schematically illustrating one manufacturing step of the wiring layer 50 according to the first embodiment of the present disclosure, and FIGS. 10B, 10C, and 10D are cross-sectional views taken along lines F1-F1, F2-F2, and F3-F3 of FIG. 10A as viewed in the direction of arrows.

Subsequently to the previous step, as illustrated in FIGS. 10A, 10B. 10C, and 10D, a FD transparent wiring 56-2 patterned in a predetermined planar shape as illustrated in FIG. 10A is formed by a conventionally known method so as to be connected to the FD transparent wiring 56-1 at a position corresponding to the FD 67 (see FIG. 4).

In addition, a transparent wiring 53R-1 patterned in a predetermined planar shape as illustrated in FIG. 10A is formed at a position corresponding to the red photoelectric conversion unit R by a conventionally known method.

Figure 11A:
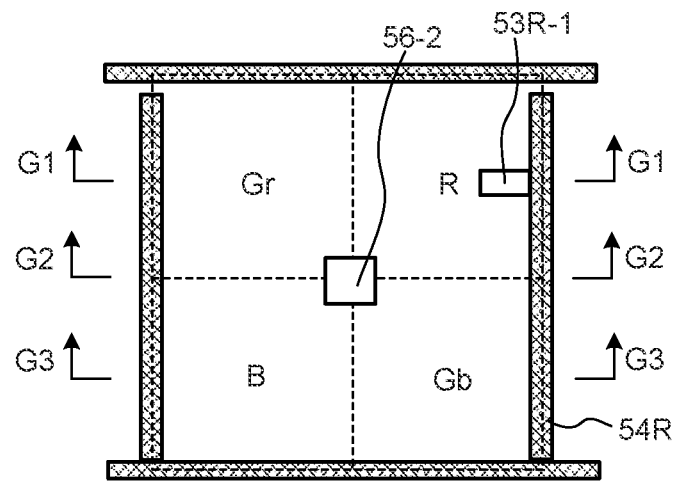
FIG. 11A is a plan view schematically illustrating one manufacturing step of the wiring layer according to the first embodiment of the present disclosure.
Figure 11B:
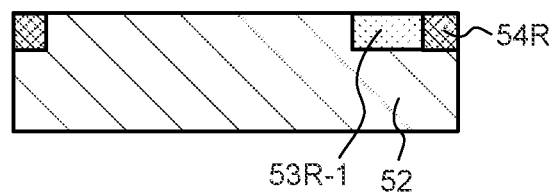
FIG. 11B is a cross-sectional view taken along line G1-G1 of FIG. 11A.
Figure 11C:
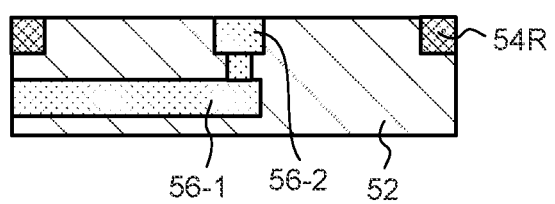
FIG. 11C is a cross-sectional view taken along line G2-G2 of FIG. 11A.
Figure 11D:
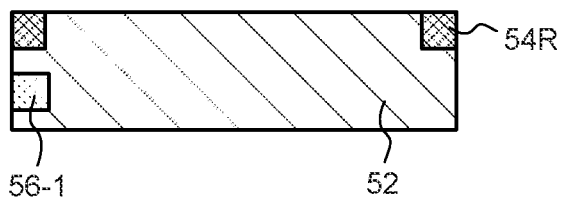
FIG. 11D is a cross-sectional view taken along line G3-G3 of FIG. 11A.

FIG. 11A is a plan view schematically illustrating one manufacturing step of the wiring layer 50 according to the first embodiment of the present disclosure, and FIGS. 11B, 11C, and 11D are cross-sectional views taken along lines G1-G1, G2-G2, and G3-G3 of FIG. 11A as viewed in the direction of arrows.

Subsequently to the previous step, as illustrated in FIGS. 11A, 11B, 11C, and 11D, the insulating layer 52 is formed by a conventionally known method so as to cover the FD transparent wiring 56-2 and the transparent wiring 53R-1 that have been formed.

In addition, the metal wiring 54R is patterned into a predetermined planar shape as illustrated in FIG. 11A, and is formed by using a chemical mechanical polishing (CMP) process, a damascene process, or the like so as to contact a side surface of the transparent wiring 53R-1.

Figure 12A:
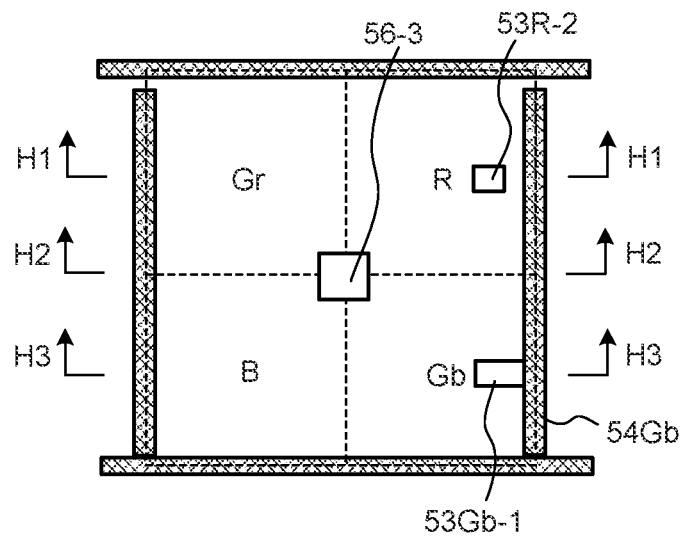
FIG. 12A is a plan view schematically illustrating one manufacturing step of the wiring layer according to the first embodiment of the present disclosure.
Figure 12B:
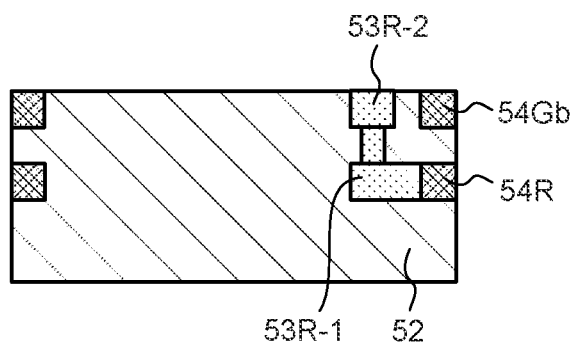
FIG. 12B is a cross-sectional view taken along line H1-H1 of FIG. 12A.
Figure 12C:
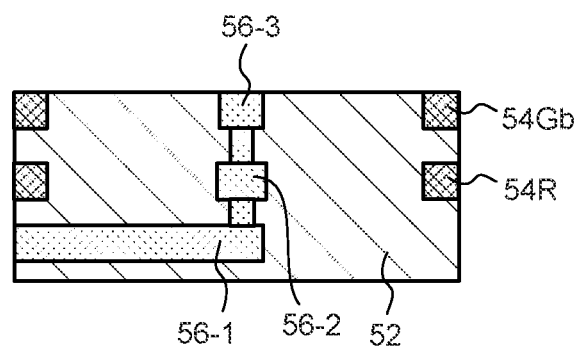
FIG. 12C is a cross-sectional view taken along line H2-H2 of FIG. 12A.
Figure 12D:
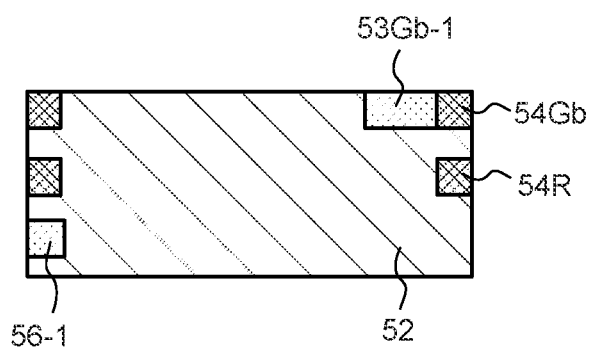
FIG. 12D is a cross-sectional view taken along line H3-H3 of FIG. 12A.

FIG. 12A is a plan view schematically illustrating one manufacturing step of the wiring layer 50 according to the first embodiment of the present disclosure, and FIGS. 12B, 12C, and 12D are cross-sectional views taken along lines H1-H1, H2-H2, and H3-H3 of FIG. 12A as viewed in the direction of arrows.

Subsequently to the previous step, as illustrated in FIGS. 12A, 12B, 12C, and 12D, the insulating layer 52 is formed by a conventionally known method so as to cover the FD transparent wiring 56-2, the transparent wiring 53R-1, and the metal wiring 54R that have been formed.

In addition, a FD transparent wiring 56-3 patterned in a predetermined planar shape as illustrated in FIG. 12A is formed by a conventionally known method so as to be connected to the FD transparent wiring 56-2 at a position corresponding to the FD 67 (see FIG. 4).

In addition, a transparent wiring 53R-2 patterned in a predetermined planar shape as illustrated in FIG. 12A is formed by a conventionally known method so as to be connected to the transparent wiring 53R-1 at a position corresponding to the red photoelectric conversion unit R.

In addition, a transparent wiring 53Gb-1 patterned in a predetermined planar shape as illustrated in FIG. 12A is formed by a conventionally known method at a position corresponding to the green photoelectric conversion unit Gb.

In addition, the metal wiring 54Gb is patterned into a predetermined planar shape as illustrated in FIG. 12A, and is formed by using the CMP process, the damascene process, or the like so as to contact a side surface of the transparent wiring 53Gb-1.

Figure 13A:
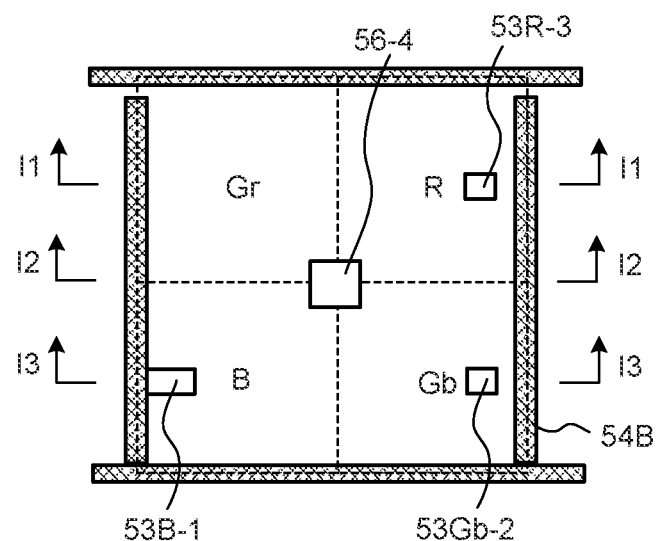
FIG. 13A is a plan view schematically illustrating one manufacturing step of the wiring layer according to the first embodiment of the present disclosure.
Figure 13B:
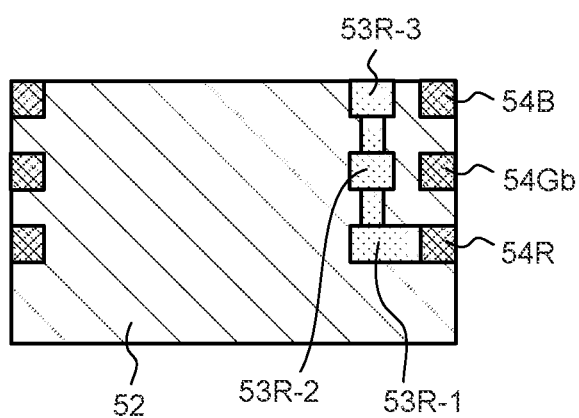
FIG. 13B is a cross-sectional view taken along line I1-I1 of FIG. 13A.
Figure 13C:
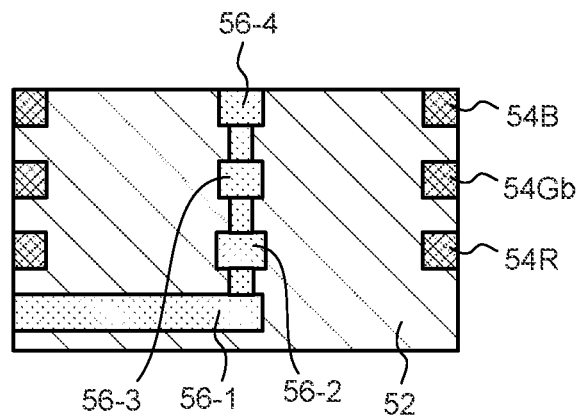
FIG. 13C is a cross-sectional view taken along line I2-I2 of FIG. 13A.
Figure 13D:
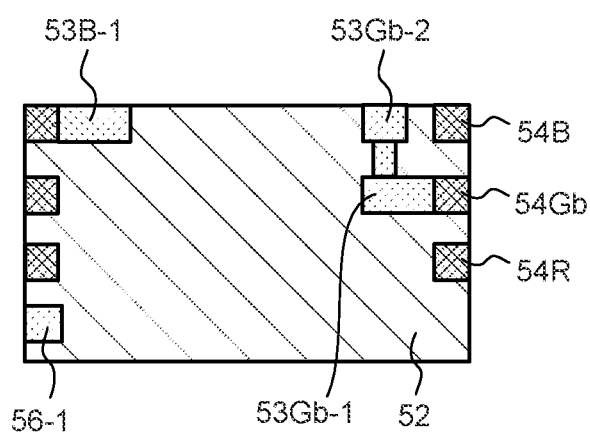
FIG. 13D is a cross-sectional view taken along line I3-I3 of FIG. 13A.

FIG. 13A is a plan view schematically showing one manufacturing step of the wiring layer 50 according to the first embodiment of the present disclosure, and FIGS. 13B, 13C, and 13D are cross-sectional views taken along lines I1-I1, I2-I2, and I3-I3 of FIG. 13A as viewed in the direction of arrows.

Subsequently to the previous step, as illustrated in FIGS. 13A, 13B. 13C, and 13D, the insulating layer 52 is formed by a conventionally known method so as to cover the FD transparent wiring 56-3, the transparent wiring 53R-2, the transparent wiring 53Gb-1, and the metal wiring 54Gb that have been formed.

In addition, a FD transparent wiring 56-4 patterned in a predetermined planar shape as illustrated in FIG. 13A is formed by a conventionally known method so as to be connected to the FD transparent wiring 56-3 at a position corresponding to the FD 67 (see FIG. 4).

In addition, a transparent wiring 53R-3 patterned in a predetermined planar shape as illustrated in FIG. 13A is formed by a conventionally known method so as to be connected to the transparent wiring 53R-2 at a position corresponding to the red photoelectric conversion unit R.

In addition, a transparent wiring 53Gb-2 patterned in a predetermined planar shape as illustrated in FIG. 13A is formed by a conventionally known method so as to be connected to the transparent wiring 53Gb-1 at a position corresponding to the green photoelectric conversion unit Gb.

In addition, a transparent wiring 53B-1 patterned in a predetermined planar shape as illustrated in FIG. 13A is formed by a conventionally known method at a position corresponding to the blue photoelectric conversion unit B.

In addition, the metal wiring 54B is patterned into a predetermined planar shape as illustrated in FIG. 13A and formed using the CMP process, the damascene process, or the like so as to contact a side surface of the transparent wiring 53B-1.

Figure 14A:
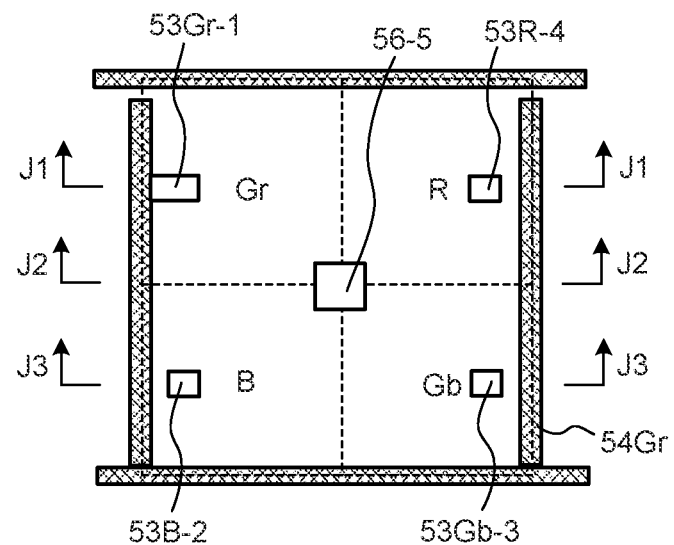
FIG. 14A is a plan view schematically illustrating one manufacturing step of the wiring layer according to the first embodiment of the present disclosure.
Figure 14B:
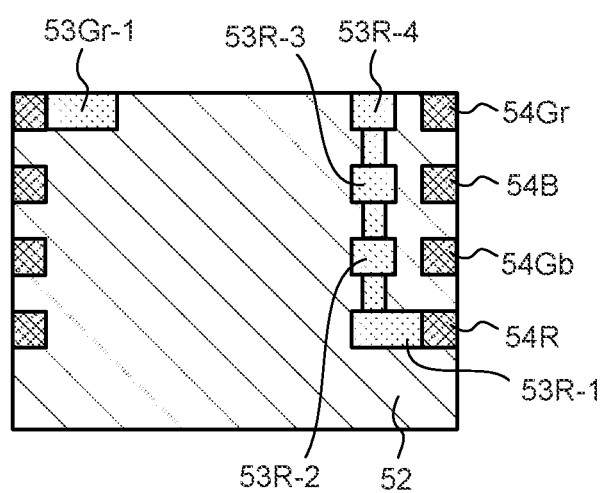
FIG. 14B is a cross-sectional view taken along line J1-J1 of FIG. 14A.
Figure 14C:
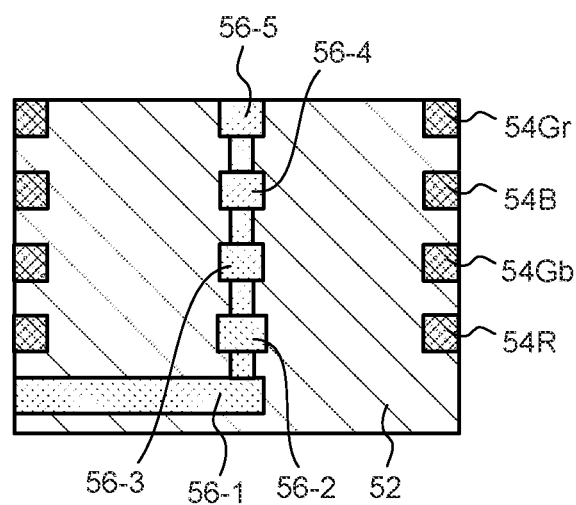
FIG. 14C is a cross-sectional view taken along line J2-J2 of FIG. 14A.
Figure 14D:
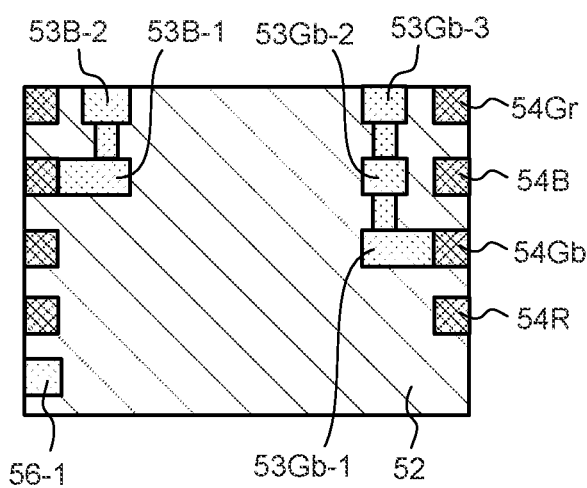
FIG. 14D is a cross-sectional view taken along line J3-J3 of FIG. 14A.

FIG. 14A is a plan view schematically showing one manufacturing step of the wiring layer 50 according to the first embodiment of the present disclosure, and FIGS. 14B, 14C, and 14D are cross-sectional views taken along lines J1-J1, J2-J2, and J3-J3 of FIG. 14A as viewed in the direction of arrows.

Subsequently to the previous step, as illustrated in FIGS. 14A, 14B. 14C, and 14D, the insulating layer 52 is formed by a conventionally known method so as to cover the FD transparent wiring 56-4, the transparent wiring 53R-3, the transparent wiring 53Gb-2, the transparent wiring 53B-1, and the metal wiring 54B that have been formed.

In addition, a FD transparent wiring 56-5 patterned in a predetermined planar shape as illustrated in FIG. 14A is formed by a conventionally known method so as to be connected to the FD transparent wiring 56-4 at a position corresponding to the FD 67 (see FIG. 4).

In addition, a transparent wiring 53R-4 patterned in a predetermined planar shape as illustrated in FIG. 14A is formed by a conventionally known method so as to be connected to the transparent wiring 53R-3 at a position corresponding to the red photoelectric conversion unit R.

In addition, a transparent wiring 53Gb-3 patterned in a predetermined planar shape as illustrated in FIG. 14A is formed by a conventionally known method so as to be connected to the transparent wiring 53Gb-2 at a position corresponding to the green photoelectric conversion unit Gb.

In addition, a transparent wiring 53B-2 patterned in a predetermined planar shape as illustrated in FIG. 14A is formed by a conventionally known method so as to be connected to the transparent wiring 53B-1 at a position corresponding to the blue photoelectric conversion unit B.

In addition, a transparent wiring 53Gr-1 patterned in a predetermined planar shape as illustrated in FIG. 14A is formed at a position corresponding to the green photoelectric conversion unit Gr by a conventionally known method.

In addition, a metal wiring 54Gr is patterned into a predetermined planar shape as illustrated in FIG. 14A and formed using the CMP process, the damascene process, or the like so as to contact a side surface of the transparent wiring 53Gr-1.

Figure 15A:
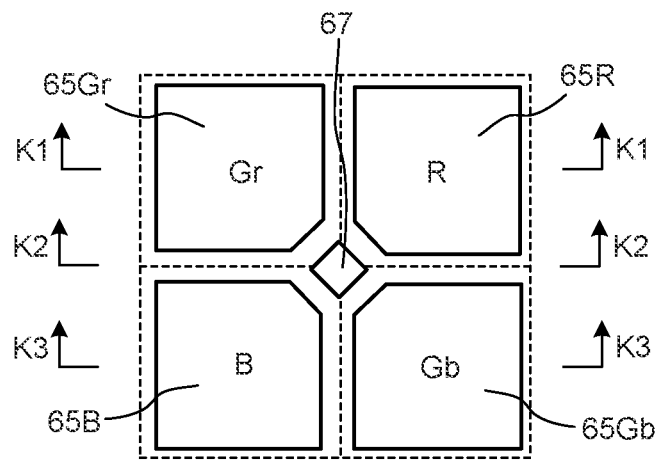
FIG. 15A is a plan view schematically illustrating one manufacturing step of the wiring layer according to the first embodiment of the present disclosure.
Figure 15B:
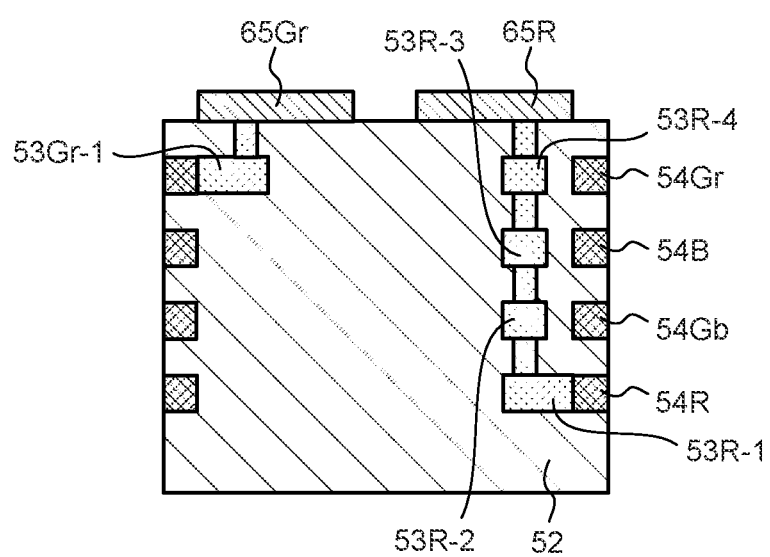
FIG. 15B is a cross-sectional view taken along line K1-K1 of FIG. 15A.
Figure 15C:
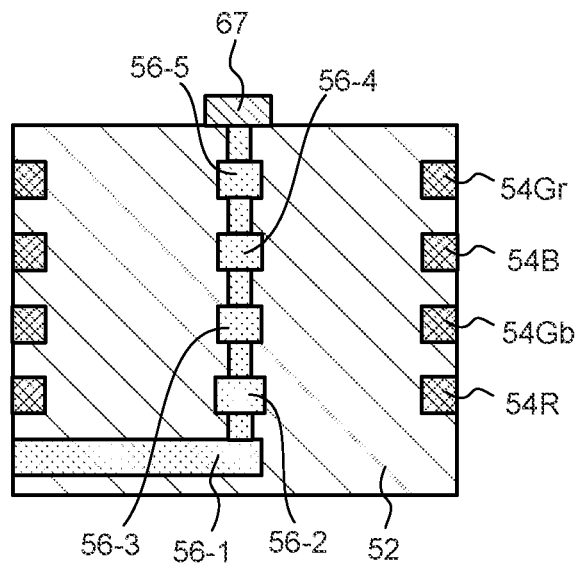
FIG. 15C is a cross-sectional view taken along line K2-K2 of FIG. 15A.
Figure 15D:
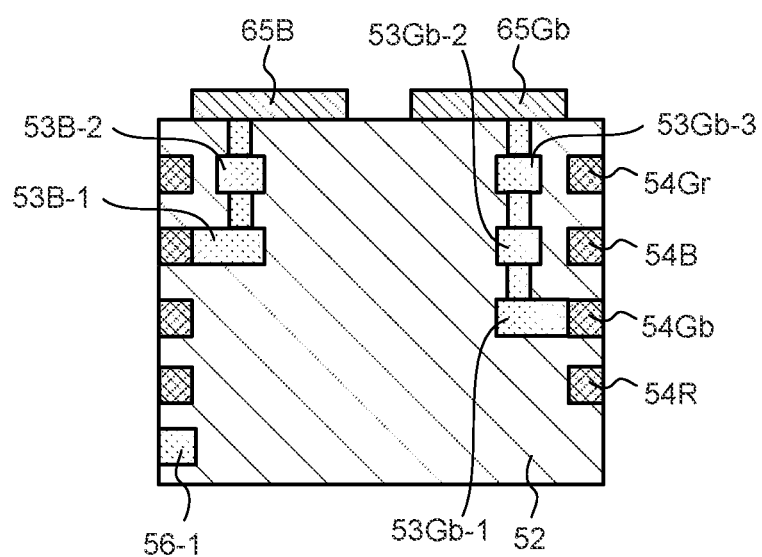
FIG. 15D is a cross-sectional view taken along line K3-K3 of FIG. 15A.

FIG. 15A is a plan view schematically illustrating one manufacturing step of the wiring layer 50 according to the first embodiment of the present disclosure, and FIGS. 15B, 15C, and 15D are cross-sectional views taken along lines K1-K1, K2-K2, and K3-K3 of FIG. 15A as viewed in the direction of arrows.

Subsequently to the previous step, as illustrated in FIGS. 15A, 15B. 15C, and 15D, the insulating layer-52 is formed by a conventionally known method so as to cover the FD transparent wiring 56-5, the transparent wiring 53R-4, the transparent wiring 53Gb-3, the transparent wiring 53B-2, the transparent wiring 53Gr-1, and the metal wiring 54Gr that have been formed.

In addition, the second electrode 65R patterned in a predetermined planar shape as illustrated in FIG. 15A is formed by a conventionally known method so as to be connected to the transparent wiring 53R-4 at a position corresponding to the red photoelectric conversion unit R.

In addition, the second electrode 65Gb patterned in a predetermined planar shape as illustrated in FIG. 15A is formed by a conventionally known method so as to be connected to the transparent wiring 53Gb-3 at a position corresponding to the green photoelectric conversion unit Gb.

In addition, the second electrode 65B patterned in a predetermined planar shape as illustrated in FIG. 15A is formed by a conventionally known method so as to be connected to the transparent wiring 53B-2 at a position corresponding to the blue photoelectric conversion unit B.

In addition, the second electrode 65Gr patterned in a predetermined planar shape as illustrated in FIG. 15A is formed by a conventionally known method so as to be connected to the transparent wiring 53Gr-1 at a position corresponding to the green photoelectric conversion unit Gr.

Furthermore, the FD 67 patterned in a predetermined planar shape as illustrated in FIG. 15A is formed by a conventionally known method so as to be connected to the FD transparent wiring 56-5 in the central portion of the light receiving pixel 11.

The wiring layer 50, the second electrode 65, and the FD 67 of the solid-state imaging element 1 according to the first embodiment are formed by the above-described various processes. In the present disclosure, the manufacturing process of the wiring layer 50 is not limited to the above example, and other steps may be used.

Various Modifications

Figure 16:
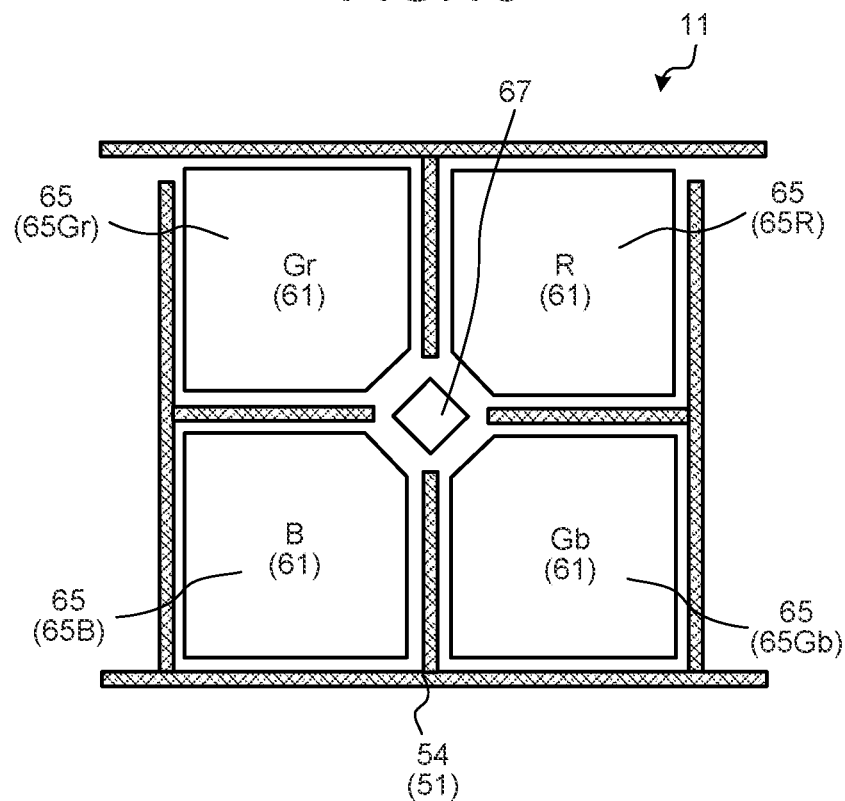
FIG. 16 is a plan view schematically illustrating an arrangement of the metal wiring according to a first modification of the first embodiment of the present disclosure.

Next, various modifications of the metal wiring 54 according to the first embodiment will be described with reference to FIGS. 16 to 21. FIG. 16 is a plan view schematically illustrating an arrangement of the metal wirings 54 according to a first modification of the first embodiment of the present disclosure.

As illustrated in FIG. 16, in the first modification, as compared with the metal wiring 54 of the first embodiment illustrated in FIG. 4, the metal wiring 54 is also arranged between adjacent organic photoelectric conversion units 61 in the light receiving pixel 11.

As a result, for example, in a case where the photodiode PD (see FIG. 2) located below the organic photoelectric conversion unit 61 is divided into two rows and two columns in the light receiving pixel 11, crosstalk between the photodiodes PD divided into two rows and two columns can be reduced.

This is because the metal wiring 54 located between the adjacent organic photoelectric conversion units 61 can function as a light-shielding wall located above the photodiode PD divided into two rows and two columns.

Note that, in the first modification, the metal wirings 54 located between the adjacent organic photoelectric conversion units 61 are not connected to each other in the central portion of the light receiving pixel 11, but are connected to the metal wirings 54 located in the peripheral portion of the light receiving pixel 11.

Figure 17:
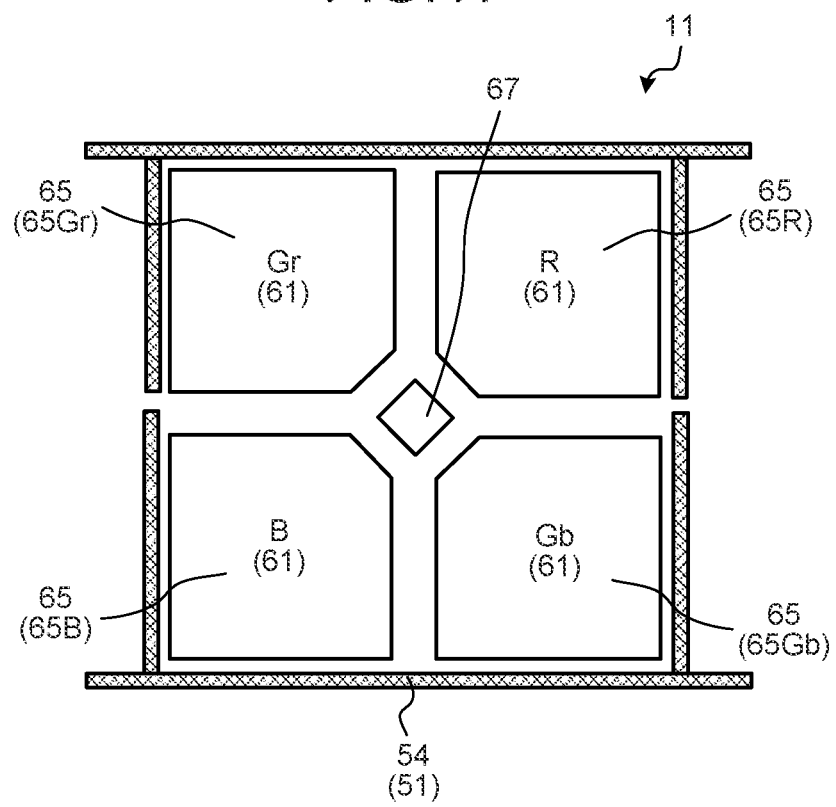
FIG. 17 is a plan view schematically illustrating an arrangement of the metal wiring according to a second modification of the first embodiment of the present disclosure.

FIG. 17 is a plan view schematically illustrating an arrangement of the metal wirings 54 according to a second modification of the first embodiment of the present disclosure. As illustrated in FIG. 17, in the second modification, the clearance formed between the metal wirings 54 adjacent in the column direction is arranged adjacent to a space between the red photoelectric conversion unit R and the green photoelectric conversion unit Gb of the light receiving pixel 11 and a space between the green photoelectric conversion unit Gr and the blue photoelectric conversion unit B.

As a result, the metal wirings 54 in the plurality of layers surround the periphery of the light receiving pixel 11, so that the metal wirings 54 can function as a light shielding wall of the light receiving pixel 11 located above the photodiode PD.

Therefore, according to the second modification, since leakage of infrared light into the photodiodes PD of the adjacent light receiving pixels 11 can be suppressed, the crosstalk between the adjacent photodiodes PD can be reduced.

Figure 18:
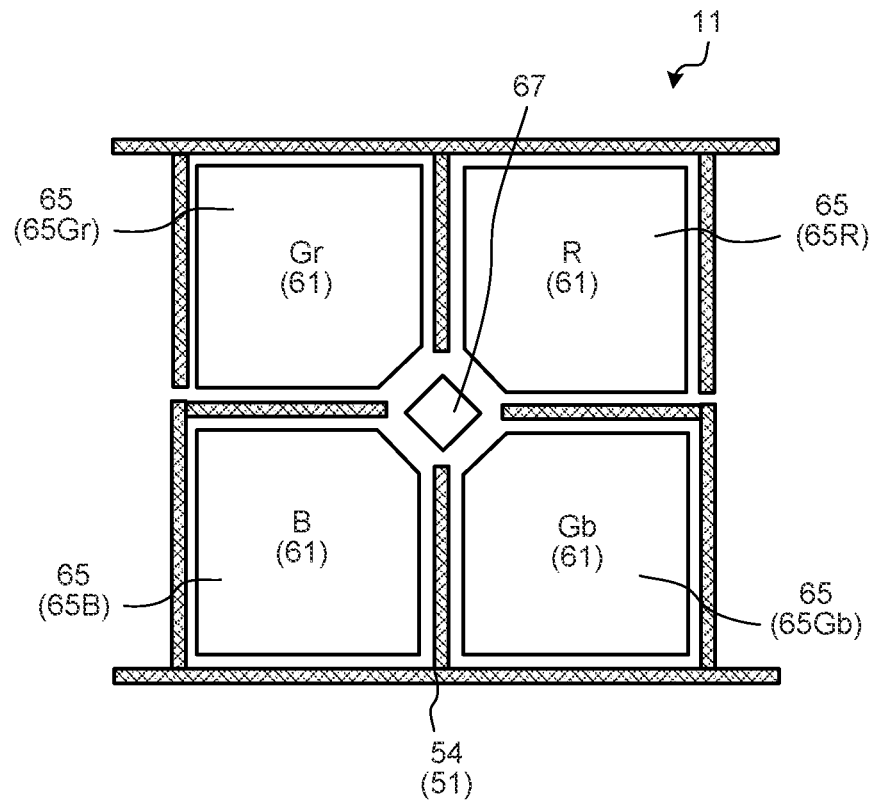
FIG. 18 is a plan view schematically illustrating an arrangement of the metal wirings according to a third modification of the first embodiment of the present disclosure.

FIG. 18 is a plan view schematically illustrating an arrangement of the metal wiring 54 according to a third modification of the first embodiment of the present disclosure. As illustrated in FIG. 18, in the third modification, as compared with the metal wiring 54 of the second modification illustrated in FIG. 17, the metal wiring 54 is also arranged between adjacent organic photoelectric conversion units 61 in the light receiving pixel 11.

As a result, for example, in a case where the photodiode PD (see FIG. 2) located below the organic photoelectric conversion unit 61 is divided into two rows and two columns in the light receiving pixel 11, crosstalk between the photodiodes PD divided into two rows and two columns can be reduced.

Note that, in the third modification, the metal wirings 54 located between the adjacent organic photoelectric conversion units 61 are not connected to each other in the central portion of the light receiving pixel 11, but are connected to the metal wiring 54 located in the peripheral portion of the light receiving pixel 11.

Figure 19:
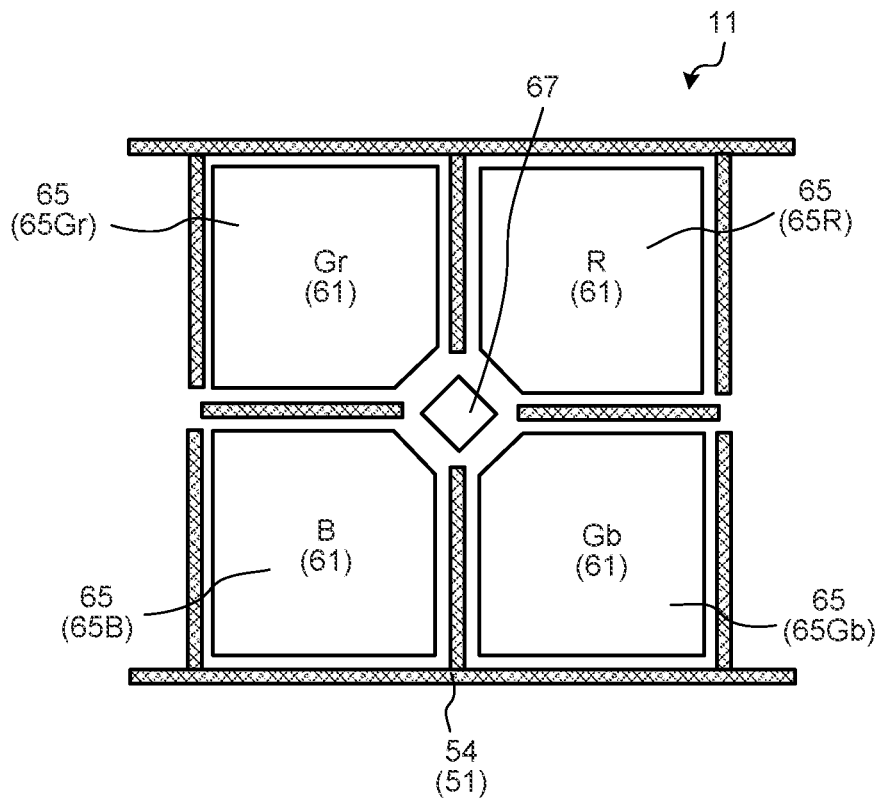
FIG. 19 is a plan view schematically illustrating an arrangement of the metal wiring according to a fourth modification of the first embodiment of the present disclosure.

FIG. 19 is a plan view schematically illustrating an arrangement of the metal wiring 54 according to a fourth modification of the first embodiment of the present disclosure. As illustrated in FIG. 19, in the fourth modification, as compared with the metal wiring 54 of the third modification illustrated in FIG. 18, the metal wiring 54 extending in the horizontal direction is not connected to other metal wirings 54 at both ends among the metal wirings 54 located between the adjacent organic photoelectric conversion units 61.

As a result, for example, in a case where the photodiode PD (see FIG. 2) located below the organic photoelectric conversion unit 61 is divided into two rows and two columns in the light receiving pixel 11, the crosstalk between the photodiodes PD divided into two rows and two columns can be reduced.

Figure 20:
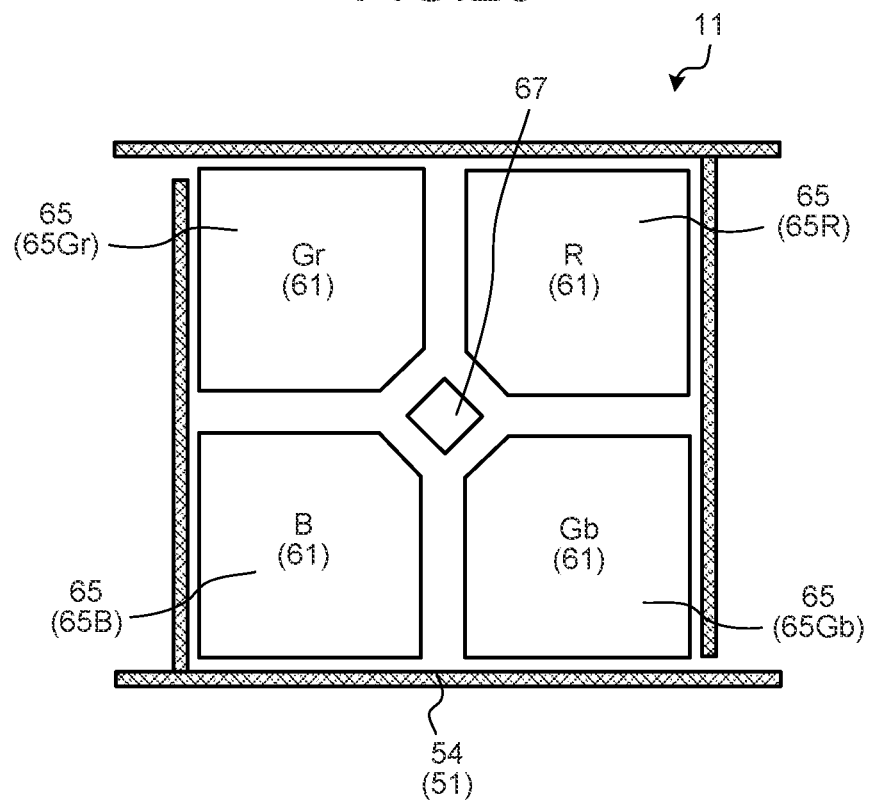
FIG. 20 is a plan view schematically illustrating an arrangement of the metal wiring according to a fifth modification of the first embodiment of the present disclosure.

FIG. 20 is a plan view schematically illustrating an arrangement of the metal wiring 54 according to a fifth modification of the first embodiment of the present disclosure. As illustrated in FIG. 20, in the fifth modification, a clearance formed between the metal wirings 54 adjacent in the column direction is arranged adjacent to the green photoelectric conversion unit Gb and the green photoelectric conversion unit Gr of the light receiving pixel 11.

As a result, the metal wiring 54 surrounds the periphery of the light receiving pixel 11, so that the metal wiring 54 can function as a light shielding wall of the light receiving pixel 11 located above the photodiode PD.

Therefore, according to the fifth modification, since leakage of infrared light into the photodiodes PD of the adjacent light receiving pixels 11 can be suppressed, the crosstalk between the adjacent photodiodes PD can be reduced.

Figure 21:
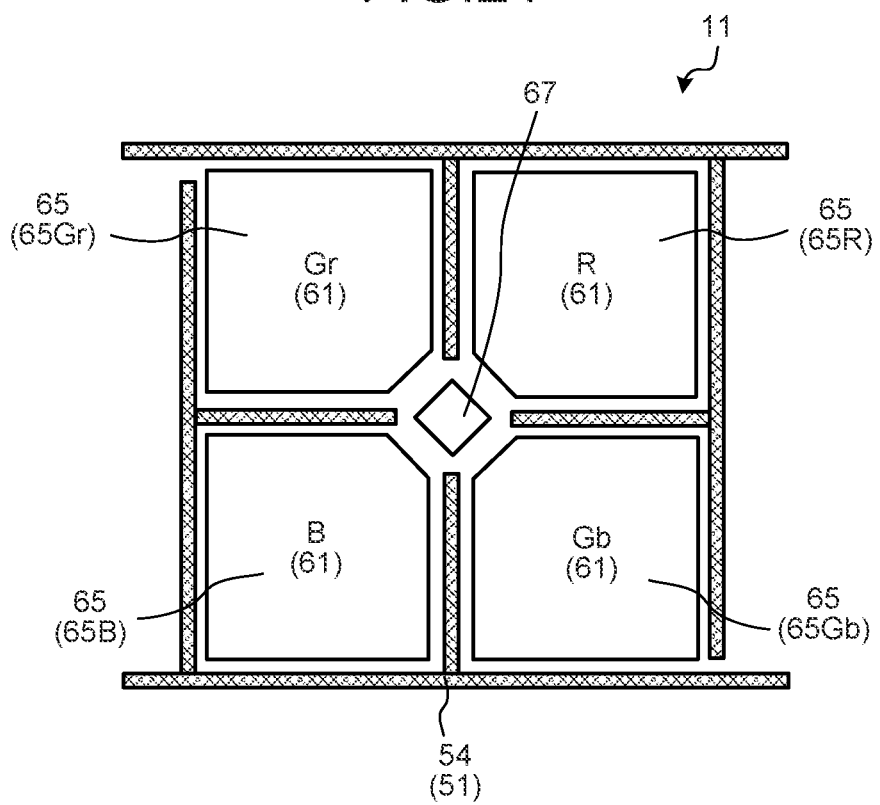
FIG. 21 is a plan view schematically illustrating an arrangement of the metal wiring according to a sixth modification of the first embodiment of the present disclosure.

FIG. 21 is a plan view schematically illustrating an arrangement of the metal wiring 54 according to a six modification of the first embodiment of the present disclosure. As shown in FIG. 21, in the sixth modification, as compared with the metal wiring 54 (see FIG. 20) of the fifth modification, the metal wiring 54 is also arranged between adjacent organic photoelectric conversion units 61 in the light receiving pixel 11.

As a result, for example, in a case where the photodiode PD (see FIG. 2) located below the organic photoelectric conversion unit 61 is divided into two rows and two columns in the light receiving pixel 11, crosstalk between the photodiodes PD divided into two rows and two columns can be reduced.

Note that, in the sixth modification, the metal wirings 54 located between the adjacent organic photoelectric conversion units 61 are not connected to each other in the central portion of the light receiving pixel 11 but connected to the metal wiring 54 in the peripheral portion of the light receiving pixel 11.

Second Embodiment

Figure 22:
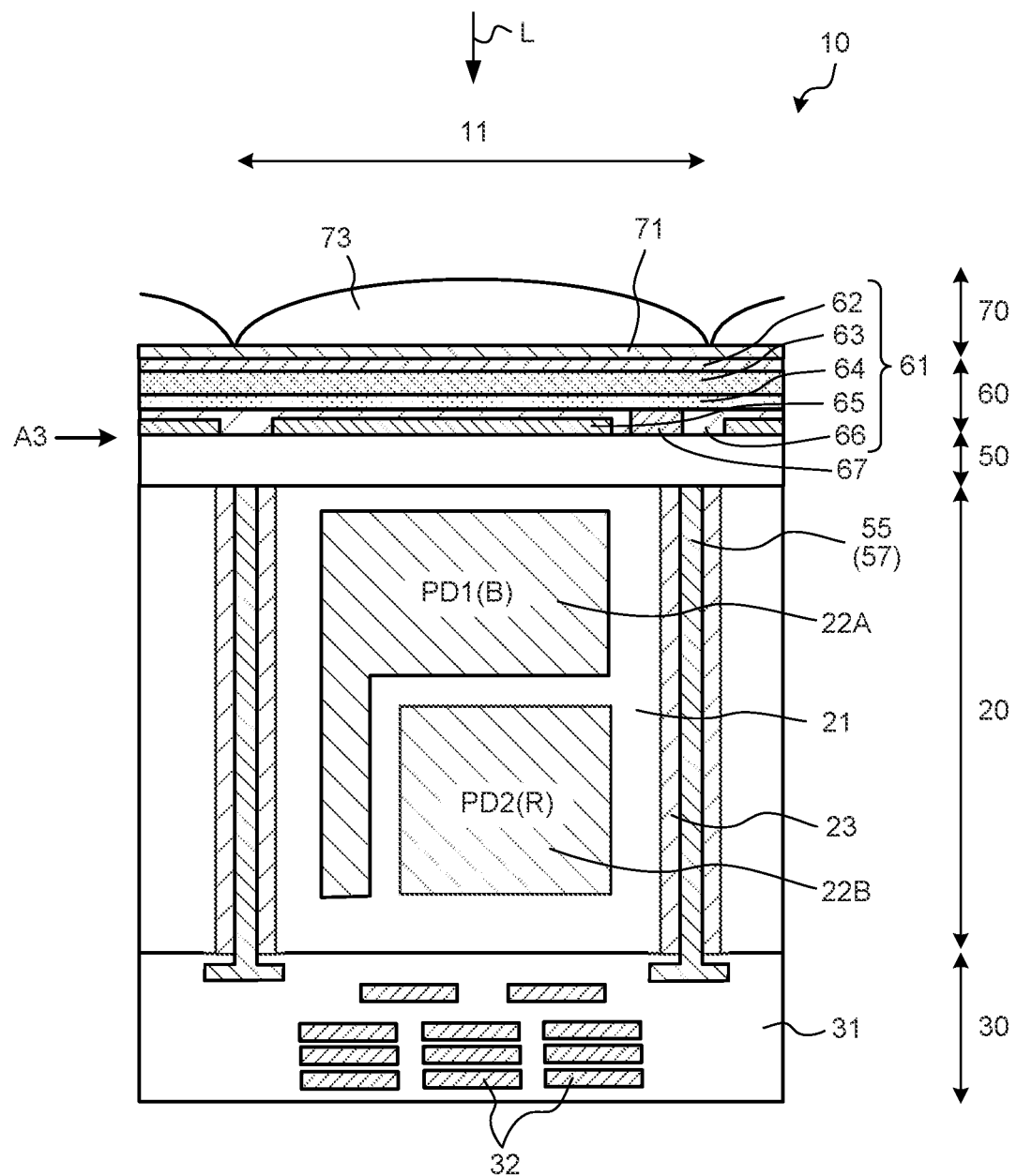
FIG. 22 is a cross-sectional view schematically illustrating a structure of a pixel array unit according to a second embodiment of the present disclosure.

Next, a pixel array unit 10 according to a second embodiment will be described with reference to FIGS. 22 to 24. FIG. 22 is a cross-sectional view schematically illustrating a structure of the pixel array unit 10 according to the second embodiment of the present disclosure.

As illustrated in FIG. 22, the pixel array unit 10 according to the second embodiment includes a semiconductor layer 20, a wiring layer 30, a wiring layer 50, an organic photoelectric conversion layer 60, and a light incident layer 70. In the pixel array unit 10, the light incident layer 70, the organic photoelectric conversion layer 60, the wiring layer 50, the semiconductor layer 20, and the wiring layer 30 are laminated in this order from a side on which incident light L from outside enters.

The semiconductor layer 20 includes a semiconductor region 21 of a first conductivity type (e.g., P type) and semiconductor regions 22A and 22B of a second conductivity type (e.g., N type). In the semiconductor region 21 of the first conductivity type, the semiconductor regions 22A and 22B of the second conductivity type are laminated in a depth direction in pixel units, whereby photodiodes PD1 and PD2 by PN junction are formed in the depth direction.

For example, the photodiode PD1 having the semiconductor region 22A as a charge accumulation region is a photoelectric conversion unit that receives and photoelectrically converts blue light, and the photodiode PD2 having the semiconductor region 22B as a charge accumulation region is a photoelectric conversion unit that receives and photoelectrically converts red light. Furthermore, the photodiodes PD1 and PD2 are formed separately for each light receiving pixel 11 of the pixel array unit 10.

The wiring layer 30 is disposed on a surface of the semiconductor layer 20 opposite to the light incident side. The wiring layer 30 is configured by forming a plurality of wiring films 32 and a plurality of pixel transistors (not illustrated) in an interlayer insulating film 31. The plurality of pixel transistors reads electric charges accumulated in the photodiodes PD1 and PD2 and an organic photoelectric conversion unit 61.

The wiring layer 50 is disposed on a surface of the semiconductor layer 20 on the light incident side. In the wiring layer 50, a connection wiring 51 (see FIG. 24), an FD wiring 55 (see FIG. 24), and the like respectively connected to the organic photoelectric conversion unit 61 and a FD 67 are arranged. A detailed structure of the wiring layer 50 according to the second embodiment will be described later.

The organic photoelectric conversion layer 60 is disposed on a surface of the wiring layer 50 on the light incident side. The organic photoelectric conversion layer 60 includes a first electrode 62, a photoelectric conversion layer 63, a charge storage layer 64, a second electrode 65, an insulating layer 66, and the FD 67.

In the organic photoelectric conversion layer 60, the first electrode 62, the photoelectric conversion layer 63, the charge storage layer 64, the insulating layer 66, and the second electrode 65 are laminated in this order from the light incident side, and the FD 67 is laminated under the charge storage layer 64 in a part of a portion where the second electrode 65 is not disposed.

Then, the first electrode 62, the photoelectric conversion layer 63, the charge storage layer 64, the insulating layer 66, and the second electrode 65 are laminated to form the organic photoelectric conversion unit 61.

Note that, in the organic photoelectric conversion layer 60, the first electrode 62, the photoelectric conversion layer 63, the charge storage layer 64, and the insulating layer 66 are commonly formed in all the light receiving pixels 11 of the pixel array unit 10. On the other hand, the second electrode 65 and the FD 67 are separately formed for each light receiving pixel 11 of the pixel array unit 10.

The first electrode 62 is disposed in the horizontal direction to a peripheral portion of the pixel array unit 10, and is electrically connected to the wiring film 32 of the wiring layer 30 via a wiring layer, a through electrode (both not illustrated), and the like at the peripheral portion of the pixel array unit 10.

As materials of the first electrode 62, the second electrode 65, and the FD 67, the same materials (e.g., ITO or the like) as those of the first electrode 62, the second electrode 65, and the FD 67 according to the first embodiment described above are used.

The photoelectric conversion layer 63 is made of an organic semiconductor material, and photoelectrically converts incident light L from the outside. As a material of the photoelectric conversion layer 63, the same material as that of the photoelectric conversion layer 63 according to the first embodiment described above is used.

When green light is photoelectrically converted by the photoelectric conversion layer 63, for example, a rhodamine-based dye, a merocyanine-based dye, a quinacridone derivative, a subphthalocyanine-based dye (subphthalocyanine derivative), or the like can be used for the photoelectric conversion layer 63.

The charge storage layer 64 is provided between the photoelectric conversion layer 63 and the insulating layer 66 or the FD 67, and stores the charge generated in the photoelectric conversion layer 63. As a material of the charge storage layer 64, a material similar to that of the charge storage layer 64 according to the above-described embodiment is used. As a material of the insulating layer 66, the same material as that of the insulating layer 66 according to the first embodiment described above is used.

The light incident layer 70 includes a planarization film 71 and an OCL 73. In the light incident layer 70, the OCL 73 and the planarization film 71 are laminated in this order from on the light incident side.

The planarization film 71 is provided to planarize the surface on which the OCL 73 is formed. The planarization film 71 is formed of, for example, silicon oxide.

The OCL 73 having a hemispherical shape is a lens that is provided for each light receiving pixel 11 and condenses the incident light L on the organic photoelectric conversion unit 61 of the light receiving pixel 11. The OCL 73 is made of, for example, an acrylic resin.

Figure 23:
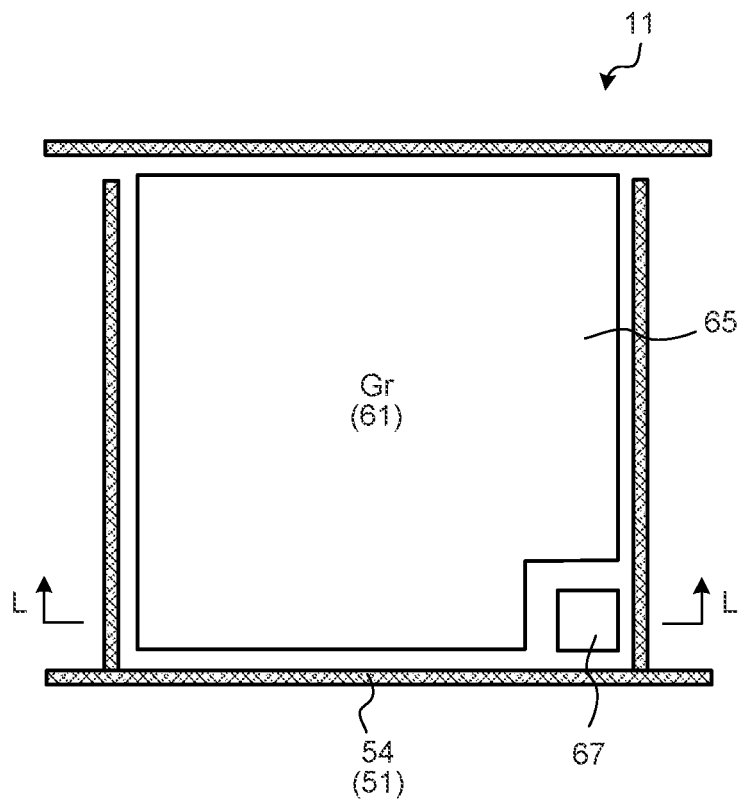
FIG. 23 is a plan view schematically illustrating an arrangement of an organic photoelectric conversion unit and a metal wiring according to the second embodiment of the present disclosure.

FIG. 23 is a plan view schematically illustrating an arrangement of the organic photoelectric conversion unit 61 in the light receiving pixel 11 according to the second embodiment of the present disclosure. Note that FIG. 23 is a view corresponding to a plan view of a depth A3 in FIG. 22. FIG. 24 is a cross-sectional view taken along line L-L of FIG. 23 as viewed in the direction of arrows.

As illustrated in FIG. 23, the organic photoelectric conversion unit 61 that will be a green photoelectric conversion unit Gr is provided in the organic photoelectric conversion layer 60 (see FIG. 22) of one light receiving pixel 11. The green photoelectric conversion unit Gr includes the second electrode 65. The second electrode 65 is arranged on substantially an entire surface in the light receiving pixel 11. Furthermore, the FD 67 is arranged in a portion adjacent to the second electrode 65 at a corner of the light receiving pixel 11.

In addition, a metal wiring 54 that is a part of the connection wiring 51 electrically connected to the second electrode 65 is arranged in a peripheral portion of the light receiving pixel 11. Unlike the first embodiment described above, the metal wiring 54 is configured with a single layer.

The metal wiring 54 is arranged so as to surround a periphery of the light receiving pixel 11 in plan view, and is made of a highly conductive metal such as tungsten, titanium, aluminum, or copper.

Figure 24:
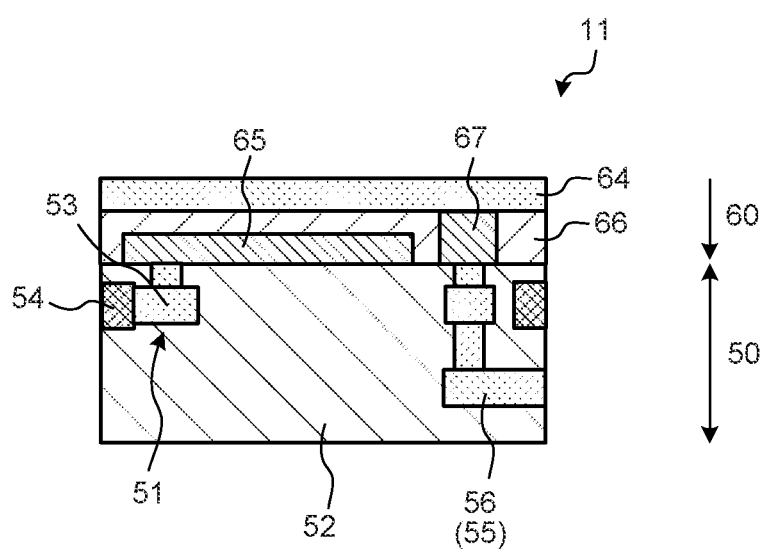
FIG. 24 is a cross-sectional view taken along line L-L of FIG. 23.

As illustrated in FIG. 24, the metal wiring 54 and the second electrode 65 are electrically connected to each other via a transparent wiring 53. In other words, the connection wiring 51 according to the second embodiment includes the transparent wiring 53 and the metal wiring 54 as in the above-described first embodiment.

The transparent wiring 53 is horizontally connected to the metal wiring 54 in the peripheral portion of the light receiving pixel 11, and is arranged to extend in the vertical direction from a connected portion toward the second electrode 65. As the material of the transparent wiring 53, the same material as the transparent wiring 53 according to the first embodiment described above (e.g., ITO) is used.

Here, in the second embodiment, similarly to the above-described first embodiment, the metal wiring 54 extends in the horizontal direction inside the wiring layer 50 from the peripheral portion of the light receiving pixel 11 to a peripheral portion of the pixel array unit 10 (see FIG. 1).

Then, the metal wiring 54 is electrically connected to the wiring film 32 (see FIG. 22) in the wiring layer 30 (see FIG. 22) via a wiring layer, a through electrode (none of which are illustrated), or the like in the peripheral portion of the pixel array unit 10.

As a result, electrical resistance of the connection wiring 51 can be reduced as compared with a case where the connection wiring 51 is formed entirely of the transparent wiring 53 from the second electrode 65 to the peripheral portion of the pixel array unit 10.

Therefore, according to the second embodiment, since a voltage drop of the drive voltage can be suppressed in the organic photoelectric conversion unit 61 of the light receiving pixel 11 located in the central portion of the pixel array unit 10, the stability of the operation of the entire pixel array unit 10 can be improved.

Furthermore, in the second embodiment, similarly to the first embodiment described above, since the metal wiring 54 extends in the horizontal direction from the peripheral portion of the light receiving pixel 11 to the peripheral portion of the pixel array unit 10, areas of the photodiodes PD1 and PD2 can be maximized. Therefore, according to the second embodiment, a quantum efficiency and a saturation charge amount of the photodiodes PD1 and PD2 can be improved.

Furthermore, in the second embodiment, the metal wiring 54 located in the peripheral portion of the light receiving pixel 11 and the second electrode 65 may be electrically connected by the transparent wiring 53. As a result, a larger amount of incident light L (see FIG. 22) can enter the photodiodes PD1 and PD2 located in a lower layer.

Therefore, according to the second embodiment, a quantum efficiency and a saturation charge amount of the photodiodes PD1 and PD2 can be improved.

In the second embodiment, similarly to the first embodiment, the FD wiring 55 electrically connected to the FD 67 includes an FD transparent wiring 56 and an FD metal wiring 57. For the FD transparent wiring 56, for example, a transparent conductive material such as ITO is used. For the FD metal wiring 57, for example, a highly conductive metal material such as tungsten, titanium, aluminum, or copper is used.

As illustrated in FIG. 24, the FD transparent wiring 56 extends from a surface of the wiring layer 50 on the light incident side to the vicinity of a bottom of the wiring layer 50. Furthermore, as illustrated in FIG. 22, the FD metal wiring 57 extends in the vertical direction to the wiring layer 30 through the semiconductor layer 20.

Note that an insulating layer 23 is disposed around the FD metal wiring 57 penetrating the semiconductor layer 20. In addition, at the corner of the light receiving pixel 11, the FD transparent wiring 56 and the FD metal wiring 57 are connected.

Here, in the second embodiment, the FD metal wiring 57 of the FD wiring 55 is preferably arranged in the vertical direction toward the wiring layer 30. As a result, a wiring path of the FD metal wiring 57 can be shortened.

Therefore, according to the second embodiment, the charge photoelectrically converted by the organic photoelectric conversion unit 61 can be quickly converted into a signal by the wiring layer 30. As a result, a signal quality of a solid-state imaging element 1 can be improved.

Third Embodiment

Figure 25:
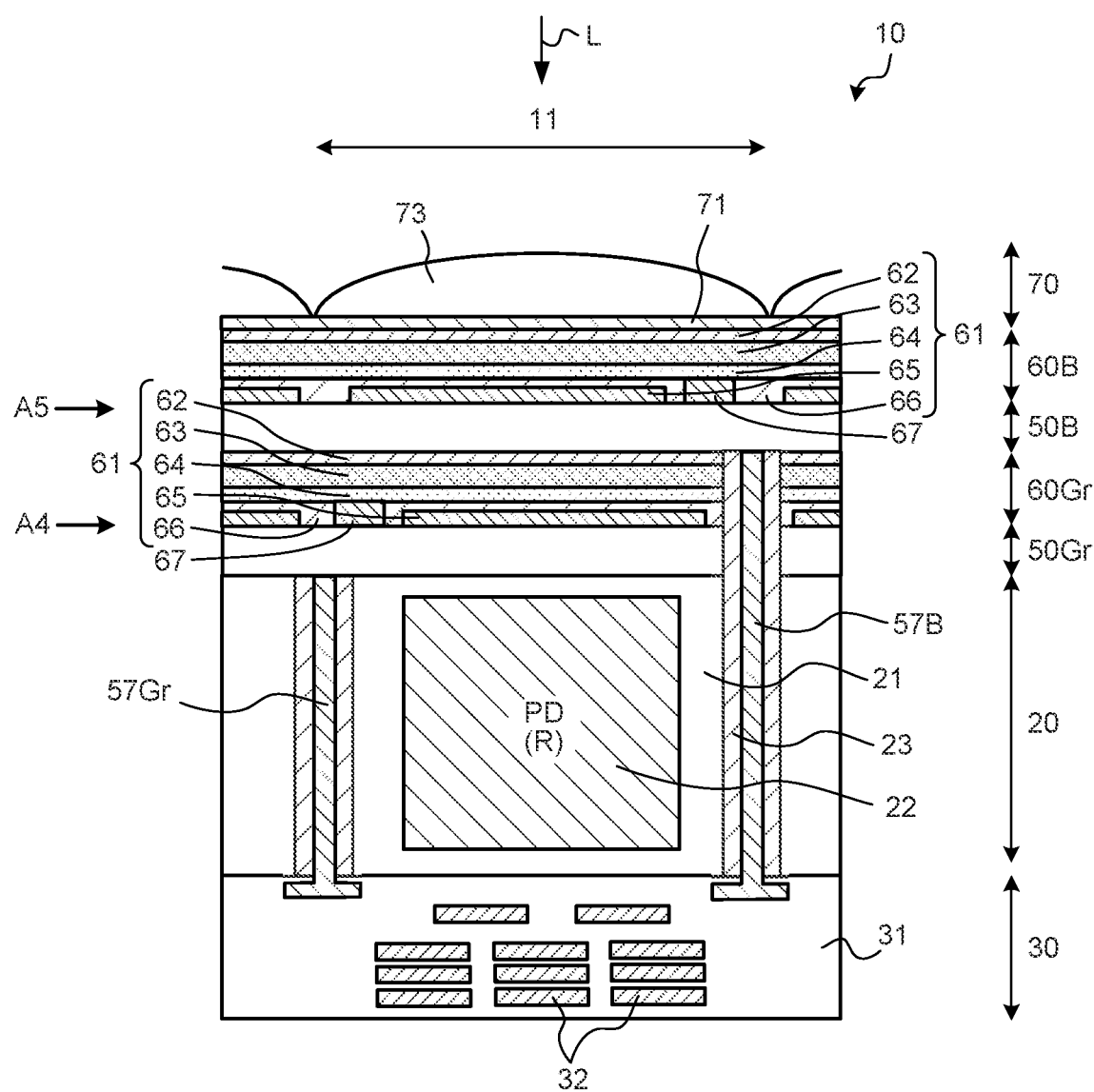
FIG. 25 is a cross-sectional view schematically illustrating a structure of a pixel array unit according to a third embodiment of the present disclosure.

Next, a pixel array unit 10 according to a third embodiment will be described with reference to FIGS. 25 to 29. FIG. 25 is a cross-sectional view schematically illustrating a structure of the pixel array unit 10 according to the third embodiment of the present disclosure.

As illustrated in FIG. 25, the pixel array unit 10 according to the third embodiment includes a semiconductor layer 20, a wiring layer 30, a wiring layer 50Gr, an organic photoelectric conversion layer 60Gr, a wiring layer 50B, an organic photoelectric conversion layer 60B, and a light incident layer 70.

In the pixel array unit 10, the light incident layer 70, the organic photoelectric conversion layer 60B, the wiring layer 50B, the organic photoelectric conversion layer 60Gr, the wiring layer 50Gr, the semiconductor layer 20, and the wiring layer 30 are laminated in this order from a side on which incident light L from outside enters.

The semiconductor layer 20 includes a semiconductor region 21 of a first conductivity type (e.g., P type) and a semiconductor region 22 of a second conductivity type (e.g., N type). Then, by forming the semiconductor region 22 of the second conductivity type in the semiconductor region 21 of the first conductivity type, a PN-junction photodiode PD is formed.

For example, the photodiode PD having the semiconductor region 22 as a charge accumulation region is a photoelectric conversion unit that receives and photoelectrically converts red light. Furthermore, the photodiode PD is formed separately for each light receiving pixel 11 of the pixel array unit 10.

The wiring layer 30 is disposed on a surface of the semiconductor layer 20 opposite to the light incident side. The wiring layer 30 is configured by forming a plurality of wiring films 32 and a plurality of pixel transistors (not illustrated) in an interlayer insulating film 31. The plurality of pixel transistors performs reading of charges accumulated in the photodiode PD and an organic photoelectric conversion unit 61.

The wiring layer 50Gr is disposed on a surface of the semiconductor layer 20 on the light incident side. In the wiring layer 50Gr, a connection wiring 51, a FD wiring 55, and the like connected to the organic photoelectric conversion unit 61 and an FD 67 of the organic photoelectric conversion layer 60Gr are arranged. A detailed structure of the wiring layer 50Gr will be described later.

The organic photoelectric conversion layer 60Gr is disposed on a surface of the wiring layer 50Gr on the light incident side. The organic photoelectric conversion layer 60Gr includes a first electrode 62, a photoelectric conversion layer 63, a charge storage layer 64, a second electrode 65, an insulating layer 66, and the FD 67.

In the organic photoelectric conversion layer 60Gr, the first electrode 62, the photoelectric conversion layer 63, the charge storage layer 64, the insulating layer 66, and the second electrode 65 are laminated in this order from the light incident side, and the FD 67 is laminated under the charge storage layer 64 in a part of a portion where the second electrode 65 is not disposed.

Figure 26:
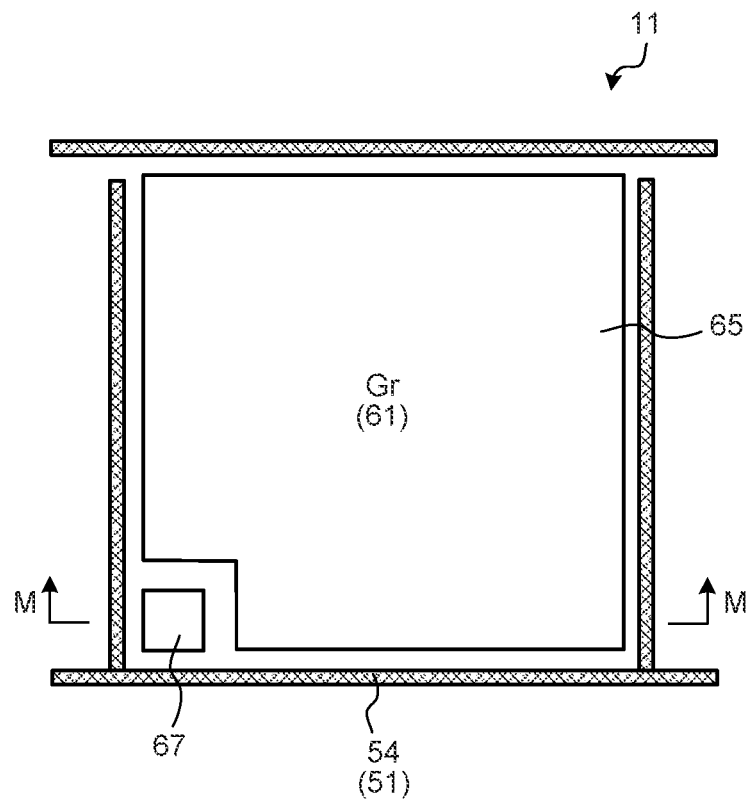
FIG. 26 is a plan view schematically illustrating an arrangement of an organic photoelectric conversion unit and a metal wiring according to the third embodiment of the present disclosure.

Then, the first electrode 62, the photoelectric conversion layer 63, the charge storage layer 64, the insulating layer 66, and the second electrode 65 are laminated to form the organic photoelectric conversion unit 61 that will be a green photoelectric conversion unit Gr (see FIG. 26).

Note that, in the organic photoelectric conversion layer 60Gr, the first electrode 62, the photoelectric conversion layer 63, the charge storage layer 64, and the insulating layer 66 are commonly formed in all the light receiving pixels 11 of the pixel array unit 10. On the other hand, the second electrode 65 and the FD 67 are separately formed for each light receiving pixel 11 of the pixel array unit 10.

The first electrode 62 is disposed in the horizontal direction to a peripheral portion of the pixel array unit 10, and is electrically connected to the wiring film 32 of the wiring layer 30 via a wiring layer, a through electrode (both not illustrated), and the like at the peripheral portion of the pixel array unit 10.

As materials of the first electrode 62, the second electrode 65, and the FD 67, the same materials (e.g., ITO or the like) as those of the first electrode 62, the second electrode 65, and the FD 67 according to the first embodiment described above are used.

The photoelectric conversion layer 63 is made of an organic semiconductor material, and photoelectrically converts incident light L from the outside. As a material of the photoelectric conversion layer 63, the same material as that of the photoelectric conversion layer 63 according to the first embodiment described above is used.

When green light is photoelectrically converted by the photoelectric conversion layer 63 of the organic photoelectric conversion layer 60Gr, for example, a rhodamine-based dye, a merocyanine-based dye, a quinacridone derivative, a subphthalocyanine-based dye (subphthalocyanine derivative), or the like can be used for the photoelectric conversion layer 63.

The charge storage layer 64 is provided between the photoelectric conversion layer 63 and the insulating layer 66 or the FD 67, and stores the charge generated in the photoelectric conversion layer 63. As a material of the charge storage layer 64, a material similar to that of the charge storage layer 64 according to the above-described embodiment is used. As a material of the insulating layer 66, the same material as that of the insulating layer 66 according to the first embodiment described above is used.

The wiring layer 50B is disposed on a surface of the organic photoelectric conversion layer 60Gr on the light incident side. In the wiring layer 50B, the connection wiring 51, the FD wiring 55, and the like connected to the organic photoelectric conversion unit 61 and the FD 67 of the organic photoelectric conversion layer 60B are arranged. A detailed structure of the wiring layer 50B will be described later.

The organic photoelectric conversion layer 60B is disposed on a surface of the wiring layer 50B on the light incident side. The organic photoelectric conversion layer 60B includes the first electrode 62, the photoelectric conversion layer 63, the charge storage layer 64, the second electrode 65, the insulating layer 66, and the FD 67.

In the organic photoelectric conversion layer 60B, the first electrode 62, the photoelectric conversion layer 63, the charge storage layer 64, the insulating layer 66, and the second electrode 65 are laminated in this order from the light incident side, and the FD 67 is laminated under the charge storage layer 64 in a part of a portion where the second electrode 65 is not disposed.

Figure 28:
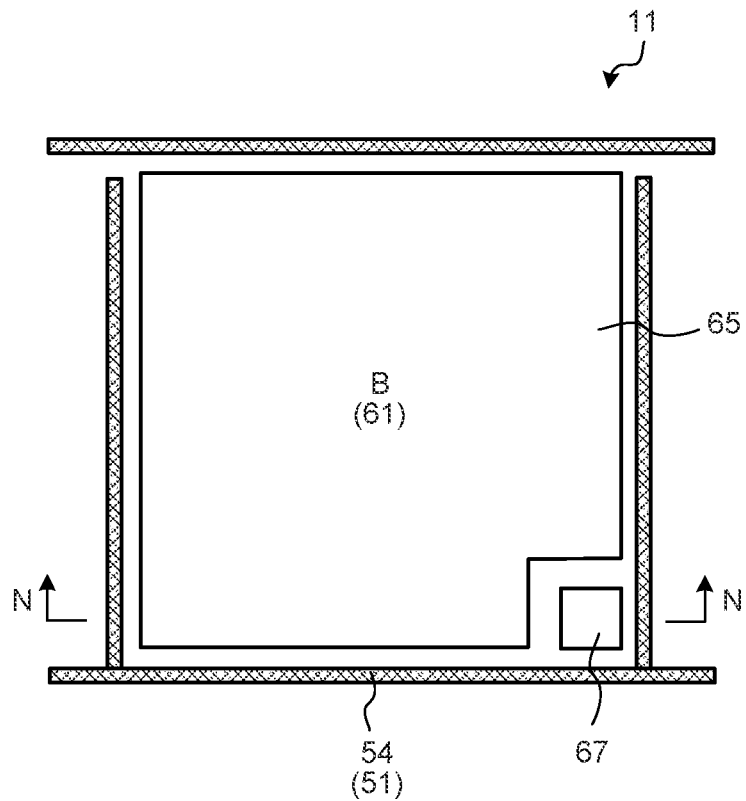
FIG. 28 is a plan view schematically illustrating an arrangement of the organic photoelectric conversion unit and the metal wiring according to the third embodiment of the present disclosure.

Then, the first electrode 62, the photoelectric conversion layer 63, the charge storage layer 64, the insulating layer 66, and the second electrode 65 are laminated to form the organic photoelectric conversion unit 61 that will be a blue photoelectric conversion unit B (see FIG. 28).

Note that, in the organic photoelectric conversion layer 60B, the first electrode 62, the photoelectric conversion layer 63, the charge storage layer 64, and the insulating layer 66 are commonly formed in all the light receiving pixels 11 of the pixel array unit 10. On the other hand, the second electrode 65 and the FD 67 are separately formed for each light receiving pixel 11 of the pixel array unit 10.

The first electrode 62 is disposed in the horizontal direction to a peripheral portion of the pixel array unit 10, and is electrically connected to the wiring film 32 of the wiring layer 30 via a wiring layer, a through electrode (both not illustrated), and the like at the peripheral portion of the pixel array unit 10.

As materials of the first electrode 62, the second electrode 65, and the FD 67, the same materials (e.g., ITO or the like) as those of the first electrode 62, the second electrode 65, and the FD 67 according to the first embodiment described above are used.

The photoelectric conversion layer 63 is made of an organic semiconductor material, and photoelectrically converts incident light L from the outside. As a material of the photoelectric conversion layer 63, the same material as that of the photoelectric conversion layer 63 according to the first embodiment described above is used.

When blue light is photoelectrically converted by the photoelectric conversion layer 63 of the organic photoelectric conversion layer 60B, for example, a coumaric acid dye, tris(8-hydroxyquinoline)aluminum (Alq3) or a merocyanine-based dye can be used for the photoelectric conversion layer 63.

The charge storage layer 64 is provided between the photoelectric conversion layer 63 and the insulating layer 66 or the FD 67, and stores the charge generated in the photoelectric conversion layer 63. As a material of the charge storage layer 64, a material similar to that of the charge storage layer 64 according to the above-described embodiment is used. As a material of the insulating layer 66, the same material as that of the insulating layer 66 according to the first embodiment described above is used.

The light incident layer 70 includes a planarization film 71 and an OCL 73. In the light incident layer 70, the OCL 73 and the planarization film 71 are laminated in this order from on the light incident side.

The planarization film 71 is provided to planarize the surface on which the OCL 73 is formed. The planarization film 71 is formed of, for example, silicon oxide.

The OCL 73 having a hemispherical shape is a lens that is provided for each light receiving pixel 11 and condenses the incident light L on the organic photoelectric conversion unit 61 of the light receiving pixel 11. The OCL 73 is made of, for example, an acrylic resin.

Figure 27:
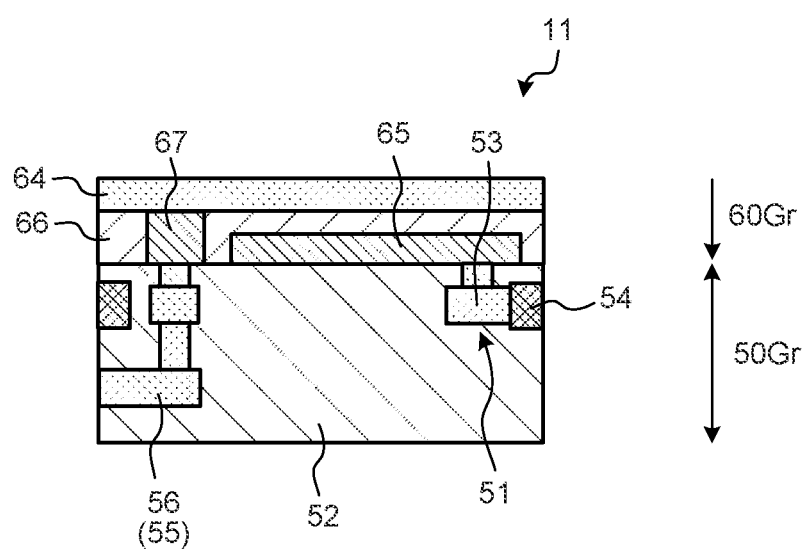
FIG. 27 is a cross-sectional view taken along line M-M of FIG. 26.

FIG. 26 is a plan view schematically illustrating an arrangement of the organic photoelectric conversion unit 61 in the light receiving pixel 11 according to the third embodiment of the present disclosure. Note that FIG. 26 is a view corresponding to a plan view of a depth A4 in FIG. 25. FIG. 27 is a cross-sectional view taken along line M-M of FIG. 26 as viewed in the direction of arrows.

As illustrated in FIG. 26, the organic photoelectric conversion unit 61 that will be a green photoelectric conversion unit Gr is provided in the organic photoelectric conversion layer 60Gr (see FIG. 25) of one light receiving pixel 11. The green photoelectric conversion unit Gr includes the second electrode 65. The second electrode 65 is arranged on substantially an entire surface in the light receiving pixel 11. Furthermore, the FD 67 is arranged in a portion adjacent to the second electrode 65 at a corner of the light receiving pixel 11.

In addition, a metal wiring 54 that is a part of the connection wiring 51 electrically connected to the second electrode 65 is arranged in a peripheral portion of the light receiving pixel 11. The metal wiring 54 is configured with a single layer as in the second embodiment described above.

The metal wiring 54 is arranged so as to surround a periphery of the light receiving pixel 11 in plan view, and is made of a highly conductive metal such as tungsten, titanium, aluminum, or copper.

As illustrated in FIG. 27, the metal wiring 54 and the second electrode 65 are electrically connected via a transparent wiring 53. In other words, the connection wiring 51 according to the third embodiment includes the transparent wiring 53 and the metal wiring 54 as in the above-described first embodiment.

The transparent wiring 53 is horizontally connected to the metal wiring 54 in the peripheral portion of the light receiving pixel 11, and is arranged to extend in the vertical direction from a connected portion toward the second electrode 65.

Here, in the third embodiment, similarly to the above-described first embodiment, the metal wiring 54 extends in the horizontal direction inside the wiring layer 50 from a peripheral portion of the light receiving pixel 11 to a peripheral portion of the pixel array unit 10 (see FIG. 1).

Then, the metal wiring 54 is electrically connected to the wiring film 32 (see FIG. 25) of the wiring layer 30 (see FIG. 25) via a wiring layer, a through electrode (none of which are illustrated), or the like in the peripheral portion of the pixel array unit 10.

As a result, electrical resistance of the connection wiring 51 can be reduced as compared with a case where the connection wiring 51 is formed entirely of the transparent wiring 53 from the second electrode 65 to the peripheral portion of the pixel array unit 10.

Therefore, according to the third embodiment, since a voltage drop of the drive voltage can be suppressed in the green photoelectric conversion unit Gr of the light receiving pixel 11 located in the central portion of the pixel array unit 10, the stability of the operation of the entire pixel array unit 10 can be improved.

Furthermore, in the third embodiment, similarly to the first embodiment described above, since the metal wiring 54 extends in the horizontal direction from the peripheral portion of the light receiving pixel 11 to the peripheral portion of the pixel array unit 10, an area of the photodiode PD can be maximized. Therefore, according to the third embodiment, a quantum efficiency and a saturation charge amount of the photodiode PD can be improved.

Further, in the third embodiment, the metal wiring 54 located in the peripheral portion of the light receiving pixel 11 and the second electrode 65 may be electrically connected by the transparent wiring 53. As a result, more incident light L (see FIG. 25) can enter the photodiode PD in a lower layer.

Therefore, according to the third embodiment, the quantum efficiency and the saturation charge amount of the photodiode PD located in the lower layer can be improved.

In the third embodiment, similarly to the first embodiment, the FD wiring 55 electrically connected to the FD 67 includes an FD transparent wiring 56 and a FD metal wiring 57Gr. For the FD transparent wiring 56, for example, a transparent conductive material such as ITO is used. For the FD metal wiring 57Gr, for example, a highly conductive metal material such as tungsten, titanium, aluminum, or copper is used.

As illustrated in FIG. 27, the FD transparent wiring 56 extends from the surface of the wiring layer 50 on the light incident side to the vicinity of a bottom of the wiring layer 50. Furthermore, as illustrated in FIG. 25, the FD metal wiring 57Gr penetrates the semiconductor layer 20 and extends in the vertical direction to the wiring layer 30.

Note that an insulating layer 23 is disposed around the FD metal wiring 57Gr penetrating the semiconductor layer 20. At the corner of the light receiving pixel 11, the FD transparent wiring 56 and the FD metal wiring 57Gr are connected.

Here, in the third embodiment, the FD metal wiring 57Gr of the FD wiring 55 is preferably arranged in the vertical direction toward the wiring layer 30. As a result, a wiring path of the FD metal wiring 57Gr can be shortened.

Therefore, according to the third embodiment, the electric charge photoelectrically converted by the green photoelectric conversion unit Gr can be quickly converted into a signal by the wiring layer 30. As a result, the signal quality of a solid-state imaging element 1 can be improved.

Figure 29:
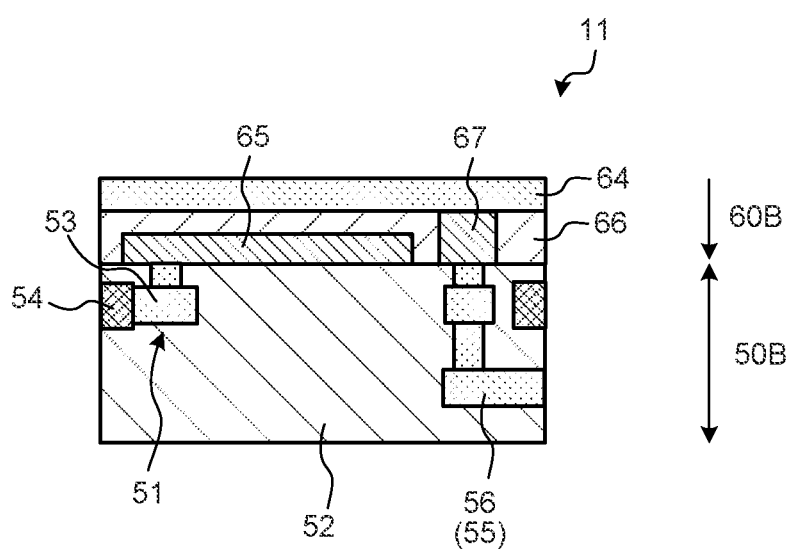
FIG. 29 is a cross-sectional view taken along line N-N of FIG. 28.

FIG. 28 is a plan view schematically illustrating an arrangement of the organic photoelectric conversion unit 61 in the light receiving pixel 11 according to the third embodiment of the present disclosure. Note that FIG. 28 is a view corresponding to a plan view of a depth A5 in FIG. 25. FIG. 29 is a cross-sectional view taken along line N-N of FIG. 28 as viewed in the direction of arrows.

As illustrated in FIG. 28, the organic photoelectric conversion unit 61 that will be a blue photoelectric conversion unit B is provided in the organic photoelectric conversion layer 60B (see FIG. 25) of one light receiving pixel 11. The blue photoelectric conversion unit B has the second electrode 65. The second electrode 65 is arranged on substantially an entire surface in the light receiving pixel 11. Furthermore, the FD 67 is arranged in a portion adjacent to the second electrode 65 at a corner of the light receiving pixel 11.

In addition, a metal wiring 54 that is a part of the connection wiring 51 electrically connected to the second electrode 65 is arranged in a peripheral portion of the light receiving pixel 11. The metal wiring 54 is configured with a single layer as in the second embodiment described above.

The metal wiring 54 is arranged so as to surround a periphery of the light receiving pixel 11 in plan view, and is made of a highly conductive metal such as tungsten, titanium, aluminum, or copper.

As illustrated in FIG. 29, the metal wiring 54 and the second electrode 65 are electrically connected via the transparent wiring 53. In other words, the connection wiring 51 according to the third embodiment includes the transparent wiring 53 and the metal wiring 54 as in the above-described first embodiment.

The transparent wiring 53 is horizontally connected to the metal wiring 54 in the peripheral portion of the light receiving pixel 11, and is arranged to extend in the vertical direction from a connected portion toward the second electrode 65.

Here, in the third embodiment, similarly to the above-described first embodiment, the metal wiring 54 extends in the horizontal direction inside the wiring layer 50 from a peripheral portion of the light receiving pixel 11 to a peripheral portion of the pixel array unit 10 (see FIG. 1).

Then, the metal wiring 54 is electrically connected to the wiring film 32 (see FIG. 25) of the wiring layer 30 (see FIG. 25) via a wiring layer, a through electrode (none of which are illustrated), or the like in the peripheral portion of the pixel array unit 10.

As a result, electrical resistance of the connection wiring 51 can be reduced as compared with a case where the connection wiring 51 is formed entirely of the transparent wiring 53 from the second electrode 65 to the peripheral portion of the pixel array unit 10.

Therefore, according to the third embodiment, since the voltage drop of the drive voltage can be suppressed in the blue photoelectric conversion unit B of the light receiving pixel 11 located in the central portion of the pixel array unit 10, the stability of the operation of the entire pixel array unit 10 can be improved.

Furthermore, in the third embodiment, similarly to the first embodiment described above, since the metal wiring 54 extends in the horizontal direction from the peripheral portion of the light receiving pixel 11 to the peripheral portion of the pixel array unit 10, an area of the photodiode PD can be maximized. Therefore, according to the third embodiment, a quantum efficiency and a saturation charge amount of the photodiode PD can be improved.

Further, in the third embodiment, the metal wiring 54 located in the peripheral portion of the light receiving pixel 11 and the second electrode 65 may be electrically connected by the transparent wiring 53. As a result, more incident light L (see FIG. 25) can enter the photodiode PD and the green photoelectric conversion unit Gr in a lower layer.

Therefore, according to the third embodiment, the quantum efficiency and the saturation charge amount of the photodiode PD and the green photoelectric conversion unit Gr located in the lower layer can be improved.

In the third embodiment, similarly to the first embodiment, the FD wiring 55 electrically connected to the FD 67 includes the FD transparent wiring 56 and a FD metal wiring 57B. For the FD transparent wiring 56, for example, a transparent conductive material such as ITO is used. For the FD metal wiring 57B, for example, a highly conductive metal material such as tungsten, titanium, aluminum, or copper is used.

As illustrated in FIG. 29, the FD transparent wiring 56 extends from the surface of the wiring layer 50 on the light incident side to close to the bottom of the wiring layer 50. Furthermore, as illustrated in FIG. 25, the FD metal wiring 57B penetrates the organic photoelectric conversion layer 60Gr, the wiring layer 50Gr, and the semiconductor layer 20 and extends in the vertical direction to the wiring layer 30.

Note that the insulating layer 23 is disposed around the FD metal wiring 57B penetrating the organic photoelectric conversion layer 60Gr, the wiring layer 50Gr, and the semiconductor layer 20. At the corner of the light receiving pixel 11, the FD transparent wiring 56 and the FD metal wiring 57B are connected.

Here, in the third embodiment, the FD metal wiring 57B of the FD wiring 55 is preferably arranged in the vertical direction toward the wiring layer 30. As a result, a wiring path of the FD metal wiring 57B can be shortened.

Therefore, according to the third embodiment, the charge photoelectrically converted by the blue photoelectric conversion unit B can be quickly converted into a signal by the wiring layer 30. As a result, the signal quality of the solid-state imaging element 1 can be improved.

Effects

The solid-state imaging element 1 according to the embodiments includes the pixel array unit 10 in which the plurality of light receiving pixels 11 is two-dimensionally arranged. Each of the light receiving pixels 11 includes the organic photoelectric conversion unit 61 and another photoelectric conversion unit (photodiodes PD, PD1, PD2). The organic photoelectric conversion unit 61 includes the photoelectric conversion layer 63 made of an organic semiconductor material, the first electrode 62 located on the light incident side of the photoelectric conversion layer 63, and the second electrode 65 (65R, 65Gr, 65Gb, 65B) located on the side opposite to the light incident side of the photoelectric conversion layer 63. Another photoelectric conversion unit (photodiodes PD, PD1, PD2) is located on the opposite side to the light incident side of the organic photoelectric conversion unit, and performs photoelectric conversion in a wavelength range different from that of the organic photoelectric conversion unit 61. The connection wiring 51 connected to the second electrode 65 (65R, 65Gr, 65Gb, 65B) includes the metal wiring 54 made of metal and the transparent wiring 53 made of the transparent conductive film, and the metal wiring 54 extends in the horizontal direction from the peripheral portion of the light receiving pixel 11 to the peripheral portion of the pixel array unit 10.

As a result, the stability of the operation of the entire pixel array unit 10 can be improved.

Furthermore, in the solid-state imaging element 1 according to the embodiments, the transparent wiring 53 electrically connects the second electrode 65 (65R, 65Gr, 65Gb, 65B) and the metal wiring 54 located in the peripheral portion of the light receiving pixel 11.

As a result, the quantum efficiency and the saturation charge amount of the photodiode PD (PD1, PD2) located in the lower layer can be improved.

Furthermore, in the solid-state imaging element 1 according to the embodiments, the metal wiring 54 and the transparent wiring 53 are connected in the horizontal direction in the peripheral portion of the light receiving pixel 11.

This can reduce crosstalk between adjacent photodiodes PD.

Furthermore, in the solid-state imaging element 1 according to the embodiments, the metal wirings 54 connected to the plurality of light receiving pixels 11 are arranged in the lattice shape along the peripheral portions of the plurality of light receiving pixels 11.

This can reduce crosstalk between adjacent photodiodes PD.

Furthermore, in the solid-state imaging element 1 according to the embodiments, the light receiving pixel 11 includes a plurality of organic photoelectric conversion units (red photoelectric conversion unit R, green photoelectric conversion units Gr and Gb, and blue photoelectric conversion unit B) and the floating diffusion 67. The plurality of organic photoelectric conversion units (red photoelectric conversion unit R, green photoelectric conversion units Gr and Gb, and blue photoelectric conversion unit B) is arranged in the horizontal direction, and performs photoelectric conversion in a plurality of wavelength ranges. The floating diffusion 67 is shared by the plurality of organic photoelectric conversion units (red photoelectric conversion unit R, green photoelectric conversion units Gr and Gb, and blue photoelectric conversion unit B). In addition, a plurality of metal wirings 54R, 54Gr, 54Gb, and 65B respectively connected to the second electrodes 65R, 65Gr, 65Gb, and 54B of the plurality of organic photoelectric conversion units is laminated and extended in the horizontal direction from the peripheral portion of the light receiving pixel 11 to the peripheral portion of the pixel array unit 10.

This can reduce crosstalk between adjacent photodiodes PD.

Furthermore, in the solid-state imaging element 1 according to the embodiments, the FD wiring 55 connected to the floating diffusion 67 includes the FD metal wiring 57 made of metal and the FD transparent wiring 56 made of a transparent conductive film. In addition, the FD metal wiring 57 extends in the vertical direction in a peripheral portion of another photoelectric conversion unit (photodiodes PD, PD1, PD2).

As a result, the signal quality of the solid-state imaging element 1 can be improved.

Furthermore, in the solid-state imaging element 1 according to the embodiments, the plurality of organic photoelectric conversion units (red photoelectric conversion unit R, green photoelectric conversion units Gr and Gb, and blue photoelectric conversion unit B) photoelectrically converts red, green, and blue light, and another photoelectric conversion unit (photodiode PD) photoelectrically converts infrared light.

As a result, it is possible to simultaneously capture a color image (RGB image) read from the plurality of organic photoelectric conversion units and a monochrome image (IR image) read from the photodiode PD.

[Electronic Apparatus]

Note that the present disclosure is not limited to application to the solid-state imaging element. In other words, in addition to the solid-state imaging element, the present disclosure is applicable to general electronic apparatuses employing the solid-state imaging element, such as a camera module, an imaging device, a mobile terminal device having an imaging function, and a copying machine using the solid-state imaging element in an image reader.

Examples of the imaging device include a digital still camera and a video camera. Examples of the mobile terminal device having the imaging function include a smartphone and a tablet terminal.

Figure 30:
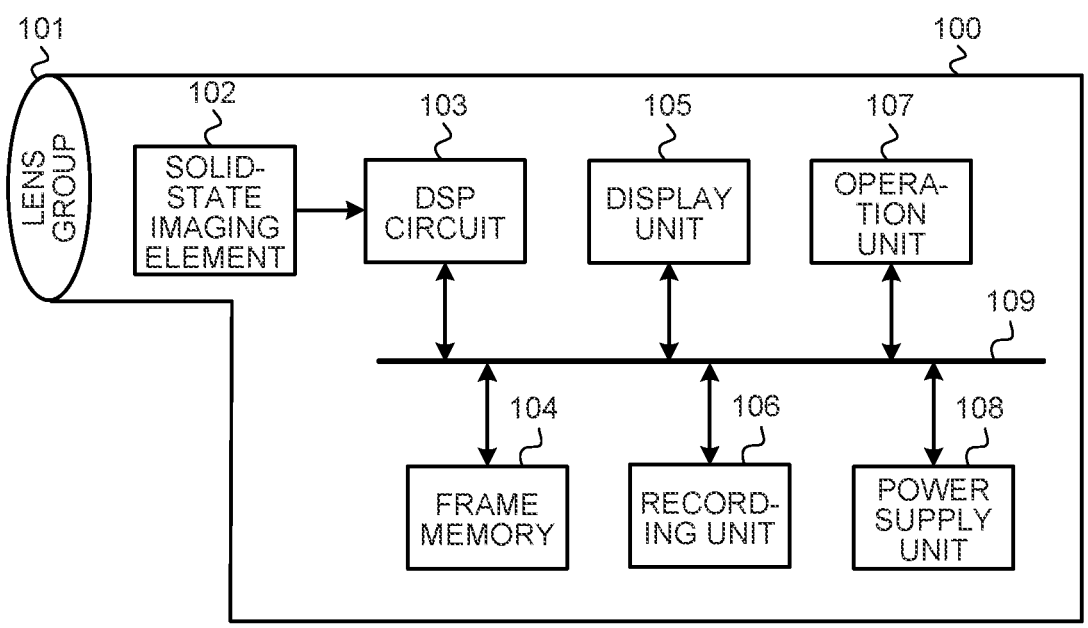
FIG. 30 is a block diagram illustrating a configuration example of an imaging device as an electronic apparatus to which the technology according to the present disclosure is applied.

FIG. 30 is a block diagram illustrating a configuration example of the imaging device as an electronic apparatus 100 to which the technology according to the present disclosure is applied. The electronic apparatus 100 in FIG. 30 is, for example, an imaging device such as a digital still camera or a video camera, or a mobile terminal device such as a smartphone or a tablet terminal.

In FIG. 30, the electronic apparatus 100 includes a lens group 101, a solid-state imaging element 102, a DSP circuit 103, a frame memory 104, a display unit 105, a recording unit 106, an operation unit 107, and a power supply unit 108.

Furthermore, in the electronic apparatus 100, the DSP circuit 103, the frame memory 104, the display unit 105, the recording unit 106, the operation unit 107, and the power supply unit 108 are mutually connected via a bus line 109.

The lens group 101 captures incident light (image light) from a subject and forms an image on an imaging surface of the solid-state imaging element 102. The solid-state imaging element 102 corresponds to the solid-state imaging element 1 according to the above-described embodiments. The solid-state imaging element 102 converts the amount of incident light imaged on the imaging surface by the lens group 101 into an electrical signal in units of pixels and outputs the electrical signal as a pixel signal.

The DSP circuit 103 is a camera signal processing circuit that processes the signal supplied from the solid-state imaging element 102. The frame memory 104 temporarily holds image data processed by the DSP circuit 103 in units of frames.

The display unit 105 includes, for example, a panel type display device such as a liquid crystal panel or an organic electro luminescence (EL) panel, and displays a moving image or a still image captured by the solid-state imaging element 102. The recording unit 106 records image data of the moving image or the still image captured by the solid-state imaging element 102 on a recording medium such as a semiconductor memory or a hard disk.

The operation unit 107 issues operation commands for various functions of the electronic apparatus 100 in accordance with an operation by a user. The power supply unit 108 appropriately supplies various power sources serving as operation power sources of the DSP circuit 103, the frame memory 104, the display unit 105, the recording unit 106, and the operation unit 107 to these supply targets.

In the electronic apparatus 100 configured as described above, the stability of the operation of the entire pixel array unit 10 can be improved by applying the solid-state imaging element 1 according to each of the above-described embodiments as the solid-state imaging element 102.

Although the embodiments of the present disclosure have been described above, the technical scope of the present disclosure is not limited to the above-described embodiments as it is, and various modifications can be made without departing from the gist of the present disclosure. In addition, the components of different embodiments and modifications may be appropriately combined.

Note that the effects described in the present specification are merely examples and not limited, and other effects may be provided.

The present technology can also have the following configurations.

(1)
A solid-state imaging element comprising a pixel array unit in which a plurality of light receiving pixels is two-dimensionally arranged, wherein
each of the plurality of light receiving pixels includes:
an organic photoelectric conversion unit having a photoelectric conversion layer made of an organic semiconductor material, a first electrode located on a light incident side of the photoelectric conversion layer, and a second electrode located on a side opposite to the light incident side of the photoelectric conversion layer, and
another photoelectric conversion unit located on a side opposite to a light incident side of the organic photoelectric conversion unit and configured to perform photoelectric conversion in a wavelength region different from a wavelength region of the organic photoelectric conversion unit,
the second electrode is connected to a connection wiring including a metal wiring made of metal and a transparent wiring made of a transparent conductive film, and
the metal wiring extends in a horizontal direction from a peripheral portion of the light receiving pixel to a peripheral portion of the pixel array unit.

(2)
The solid-state imaging element according to the above (1), wherein
the transparent wiring electrically connects the second electrode and the metal wiring located in the peripheral portion of the light receiving pixel.

(3)
The solid-state imaging element according to the above (2), wherein
the metal wiring and the transparent wiring are connected in the horizontal direction in the peripheral portion of the light receiving pixel.

(4)
The solid-state imaging element according to any one of the above (1) to (3), wherein
the metal wiring connected to the plurality of light receiving pixels is arranged in a lattice shape along the peripheral portion of the plurality of light receiving pixels.

(5)
The solid-state imaging element according to any one of the above (1) to (4), wherein
each of the plurality of light receiving pixels includes:
a plurality of the organic photoelectric conversion units arranged in the horizontal direction and configured to perform photoelectric conversion in a plurality of wavelength regions, and
a floating diffusion shared by the plurality of organic photoelectric conversion units, and
a plurality of the metal wirings respectively connected to the plurality of organic photoelectric conversion units at the second electrode is laminated to each other and extends in the horizontal direction from the peripheral portion of the light receiving pixel to the peripheral portion of the pixel array unit.

(6)
The solid-state imaging element according to the above (5), wherein
the floating diffusion is connected to an FD wiring including an FD metal wiring made of metal and an FD transparent wiring made of a transparent conductive film, and
the FD metal wiring extends in a vertical direction in a peripheral portion of the other photoelectric conversion unit.

(7)
The solid-state imaging element according to the above (5) or (6), wherein
the plurality of organic photoelectric conversion units photoelectrically converts red light, green light, and blue light, and
the other photoelectric conversion unit photoelectrically converts infrared light.

(8)
An electronic apparatus comprising:
a solid-state imaging element;
an optical system configured to capture incident light from a subject and form an image on an imaging surface of the solid-state imaging element; and
a signal processing circuit configured to perform processing on an output signal from the solid-state imaging element, wherein the solid-state imaging element includes a pixel array unit in which a plurality of light receiving pixels is two-dimensionally arranged, each of the light receiving pixels includes:

an organic photoelectric conversion unit having a photoelectric conversion layer made of an organic semiconductor material, a first electrode located on a light incident side of the photoelectric conversion layer, and a second electrode located on a side opposite to the light incident side of the photoelectric conversion layer, and another photoelectric conversion unit located on a side opposite to the light incident side of the organic photoelectric conversion unit and configured to perform photoelectric conversion in a wavelength region different from a wavelength region of the organic photoelectric conversion unit, the second electrode is connected to a connection wiring including a metal wiring made of metal and a transparent wiring made of a transparent conductive film, and the metal wiring extends in a horizontal direction from a peripheral portion of the light receiving pixel to a peripheral portion of the pixel array unit.

(9)

The electronic apparatus according to the above (8), wherein the transparent wiring electrically connects the second electrode and the metal wiring located in the peripheral portion of the light receiving pixel.

(10)

The electronic apparatus according to the above (9), wherein the metal wiring and the transparent wiring are connected in the horizontal direction in the peripheral portion of the light receiving pixel.

(11)

The electronic apparatus according to any one of the above (8) to (10), wherein the metal wiring connected to the plurality of light receiving pixels is arranged in a lattice shape along the peripheral portion of the plurality of light receiving pixels.

(12)

The electronic apparatus according to any one of the above (8) to (11), wherein each of the plurality of light receiving pixels includes:

a plurality of the organic photoelectric conversion units arranged in the horizontal direction and configured to perform photoelectric conversion in a plurality of wavelength regions, and a floating diffusion shared by the plurality of organic photoelectric conversion units, and a plurality of the metal wirings respectively connected to the plurality of organic photoelectric conversion units at the second electrode is laminated to each other and extends in the horizontal direction from the peripheral portion of the light receiving pixel to the peripheral portion of the pixel array unit.

(13)

The electronic apparatus according to the above (12), wherein the floating diffusion is connected to an FD wiring including an FD metal wiring made of metal and an FD transparent wiring made of a transparent conductive film, and the FD metal wiring extends in a vertical direction in a peripheral portion of the other photoelectric conversion unit.

(14)

The electronic apparatus according to the above (12) or (13), wherein the plurality of organic photoelectric conversion units photoelectrically converts red light, green light, and blue light, and the other photoelectric conversion unit photoelectrically converts infrared light.

REFERENCE SIGNS LIST

1 SOLID-STATE IMAGING ELEMENT
10 PIXEL ARRAY UNIT
11 LIGHT RECEIVING PIXEL
50 WIRING LAYER
51 CONNECTION WIRING
53 TRANSPARENT WIRING
54, 54R, 54Gr, 54Gb, 54B METAL WIRING
55 FD WIRING
56 FD TRANSPARENT WIRING
57 FD METAL WIRING
60 ORGANIC PHOTOELECTRIC CONVERSION LAYER
61 ORGANIC PHOTOELECTRIC CONVERSION UNIT
62 FIRST ELECTRODE
63 PHOTOELECTRIC CONVERSION LAYER
65, 65R, 65Gr, 65Gb, 65B SECOND ELECTRODE
67 FLOATING DIFFUSION (FD)
100 ELECTRONIC APPARATUS
PD, PD1, PD2 PHOTODIODE (AN EXAMPLE OF ANOTHER PHOTOELECTRIC CONVERSION UNIT)

The invention claimed is:

1. A solid-state imaging element, comprising a pixel array unit in which a plurality of light receiving pixels is two-dimensionally arranged, wherein each of the plurality of light receiving pixels includes:

an organic photoelectric conversion unit having a photoelectric conversion layer made of an organic semiconductor material, a first electrode located on a light incident side of the photoelectric conversion layer, and a second electrode located on a side opposite to the light incident side of the photoelectric conversion layer; and a photoelectric conversion unit located on a side opposite to a light incident side of the organic photoelectric conversion unit and configured to perform photoelectric conversion in a wavelength region different from a wavelength region of the organic photoelectric conversion unit, the second electrode is connected to a connection wiring including a metal wiring made of a metal and a transparent wiring made of a transparent conductive film, and the metal wiring extends in a horizontal direction from a peripheral portion of a light receiving pixel of the plurality of light receiving pixels to a peripheral portion of the pixel array unit.

2. The solid-state imaging element according to claim 1, wherein the transparent wiring electrically connects the second electrode and the metal wiring located in the peripheral portion of the light receiving pixel.

3. The solid-state imaging element according to claim 2, wherein
the metal wiring and the transparent wiring are connected in the horizontal direction in the peripheral portion of the light receiving pixel.

4. The solid-state imaging element according to claim 1, wherein
the metal wiring connected to the plurality of light receiving pixels is arranged in a lattice shape along the peripheral portion of the plurality of light receiving pixels.

5. The solid-state imaging element according to claim 1, wherein each of the plurality of light receiving pixels includes:
a plurality of organic photoelectric conversion units arranged in the horizontal direction and configured to perform photoelectric conversion in a plurality of wavelength regions, wherein the plurality of organic photoelectric conversion units includes the organic photoelectric conversion unit; and
a floating diffusion shared by the plurality of organic photoelectric conversion units; and
a plurality of metal wirings respectively connected to the plurality of organic photoelectric conversion units at the second electrode is laminated to each other and extends in the horizontal direction from the peripheral portion of the light receiving pixel to the peripheral portion of the pixel array unit, wherein the plurality of metal wirings includes the metal wiring.

6. The solid-state imaging element according to claim 5, wherein
the floating diffusion is connected to an FD wiring including an FD metal wiring made of the metal and an FD transparent wiring made of the transparent conductive film, and
the FD metal wiring extends in a vertical direction in a peripheral portion of the photoelectric conversion unit.

7. The solid-state imaging element according to claim 5, wherein
the plurality of organic photoelectric conversion units photoelectrically converts red light, green light, and blue light, and
the photoelectric conversion unit photoelectrically converts infrared light.

8. An electronic apparatus, comprising:
a solid-state imaging element;
an optical system configured to capture incident light from a subject and form an image on an imaging surface of the solid-state imaging element; and
a signal processing circuit configured to perform processing on an output signal from the solid-state imaging element, wherein
the solid-state imaging element includes a pixel array unit in which a plurality of light receiving pixels is two-dimensionally arranged,
each of the light receiving pixels includes:
an organic photoelectric conversion unit having a photoelectric conversion layer made of an organic semiconductor material, a first electrode located on a light incident side of the photoelectric conversion layer, and a second electrode located on a side opposite to the light incident side of the photoelectric conversion layer, and
a photoelectric conversion unit located on a side opposite to a light incident side of the organic photoelectric conversion unit and configured to perform photoelectric conversion in a wavelength region different from a wavelength region of the organic photoelectric conversion unit,
the second electrode is connected to a connection wiring including a metal wiring made of metal and a transparent wiring made of a transparent conductive film, and
the metal wiring extends in a horizontal direction from a peripheral portion of a light receiving pixel of the plurality of light receiving pixels to a peripheral portion of the pixel array unit.

* * * * *